US006418042B1

(12) United States Patent
Srinivasan et al.

(10) Patent No.: US 6,418,042 B1
(45) Date of Patent: *Jul. 9, 2002

(54) TERNARY CONTENT ADDRESSABLE MEMORY WITH COMPARE OPERAND SELECTED ACCORDING TO MASK VALUE

(75) Inventors: Varadarajan Srinivasan, Los Altos Hills; Bindiganavale S. Nataraj, Cupertino; Sandeep Khanna, Santa Clara, all of CA (US)

(73) Assignee: NetLogic Microsystems, Inc.

( * ) Notice: Subject to any disclaimer, the term of this patent is extended or adjusted under 35 U.S.C. 154(b) by 0 days.

This patent is subject to a terminal disclaimer.

(21) Appl. No.: 09/150,517

(22) Filed: Sep. 9, 1998

Related U.S. Application Data

(63) Continuation-in-part of application No. 08/967,314, filed on Oct. 30, 1997, now Pat. No. 6,199,140.

(51) Int. Cl.[7] .............................................. G11C 15/00

(52) U.S. Cl. ....................................... 365/49; 711/108

(58) Field of Search ................................ 711/108, 203; 365/49; 370/392; 380/50

(56) References Cited

U.S. PATENT DOCUMENTS

| 3,257,646 | A | 6/1966 | Roth |
| 3,353,159 | A | 11/1967 | Lee, III |
| 3,602,899 | A | 8/1971 | Lindquist et al. |
| 3,675,211 | A | 7/1972 | Raviv |
| 3,685,020 | A | 8/1972 | Meade |
| 3,868,642 | A | 2/1975 | Sachs |
| 4,112,502 | A | 9/1978 | Scheuneman |

(List continued on next page.)

FOREIGN PATENT DOCUMENTS

| EP | 0 660 332 A | 12/1993 |
| JP | 04021997 | 1/1992 |
| JP | 08167295 | 6/1996 |

OTHER PUBLICATIONS

Motorola Semiconductor Technical Data, "Advanced Information 16X×64 CAM", MCM69C432, Jan. 1996, pp. 4 pages.

GEC Plessey Semiconductors, "P2800 Multi–port Content Addressable Memory Functional Product Specification GPS–FPS–2800–12" Jan. 1996, pp. 1–102.

(List continued on next page.)

Primary Examiner—B. James Peikari
(74) Attorney, Agent, or Firm—Blakely, Sokoloff, Taylor & Zafman LLP

(57) ABSTRACT

A content addressable memory (CAM) device. The CAM device is a synchronous device that may perform all of the following operations all in one clock cycle: (1) receive comparand data from a comparand bus; (2) receive an instruction from an instruction bus instructing the CAM device to compare the comparand data with a first group of CAM cells in a CAM array; (3) perform the comparison of the comparand data with the first group of CAM cells; (4) generate a match address for a location in the CAM array that stores data matching the comparand data; (5) access data stored in a second group of the CAM cells in the CAM array, wherein the second group of CAM cells may store data associated with the matched location; and (6) output to an output bus the match address, the data stored in the second group of CAM cells, and/or status information corresponding to the matched address or the second group of CAM cells. The status information may include a match flag, multiple match flag, full flag, skip bit, empty bit, or a device identification for the CAM device. The CAM array may also include ternary CAM cells that are individually maskable so as to effectively store either a logic one, logic zero, or a don't care state for compare operations.

75 Claims, 19 Drawing Sheets

U.S. PATENT DOCUMENTS

| | | | |
|---|---|---|---|
| 4,244,033 A | 1/1981 | Hattori | |
| 4,472,805 A | 9/1984 | Wacyk et al. | |
| 4,523,301 A | 6/1985 | Kadota et al. | 365/49 |
| 4,646,271 A | 2/1987 | Uchiyama et al. | 365/49 |
| 4,656,626 A | 4/1987 | Yudichak et al. | |
| 4,670,858 A | 6/1987 | Almy | 365/49 |
| 4,723,224 A * | 2/1988 | Hulett et al. | 365/49 |
| 4,747,080 A | 5/1988 | Yamada | 365/200 |
| 4,758,982 A | 7/1988 | Price | |
| 4,780,845 A | 10/1988 | Threewitt | 365/49 |
| 4,785,398 A | 11/1988 | Joyce et al. | |
| 4,791,606 A | 12/1988 | Threewitt et al. | 364/49 |
| 4,813,002 A | 3/1989 | Joyce et al. | 364/49 |
| 4,845,668 A | 7/1989 | Sano et al. | 365/49 |
| 4,897,813 A | 1/1990 | Kumbasar | |
| 4,903,234 A | 2/1990 | Sakuraba et al. | 365/49 |
| 4,928,260 A * | 5/1990 | Chuang et al. | 365/49 |
| 4,958,377 A | 9/1990 | Takahashi | |
| 4,959,811 A | 9/1990 | Szczepanek | 365/49 |
| 4,975,873 A | 12/1990 | Nakabayashi et al. | 365/49 |
| 4,996,666 A | 2/1991 | Duluk, Jr. | 365/49 |
| 5,010,516 A | 4/1991 | Oates | 365/49 |
| 5,014,195 A | 5/1991 | Farrell et al. | |
| 5,034,919 A * | 7/1991 | Sasai et al. | 365/49 |
| 5,036,486 A | 7/1991 | Noguchi et al. | 365/49 |
| 5,051,948 A | 9/1991 | Watabe et al. | 365/49 |
| 5,053,991 A | 10/1991 | Burrows | 365/49 |
| 5,072,422 A | 12/1991 | Rachels | |
| 5,107,501 A | 4/1992 | Zorian | |
| 5,111,427 A | 5/1992 | Kobayashi et al. | 365/49 |
| 5,226,005 A | 7/1993 | Lee et al. | 365/49 |
| 5,265,100 A | 11/1993 | McClure et al. | |
| 5,267,213 A | 11/1993 | Sung et al. | |
| 5,319,589 A | 6/1994 | Yamagata et al. | |
| 5,319,590 A | 6/1994 | Montoye | |
| 5,383,146 A | 1/1995 | Threewitt | 365/49 |
| 5,396,449 A | 3/1995 | Atallah et al. | |
| 5,414,704 A | 5/1995 | Spinney | |
| 5,422,838 A * | 6/1995 | Lin | 365/49 |
| 5,428,565 A | 6/1995 | Shaw | |
| 5,440,709 A | 8/1995 | Edgar | |
| 5,440,715 A * | 8/1995 | Wyland | 711/108 |
| 5,446,685 A | 8/1995 | Holst | |
| 5,454,094 A | 9/1995 | Montoye | |
| 5,455,576 A | 10/1995 | Clark, II et al. | |
| 5,469,161 A | 11/1995 | Bezek | 341/51 |
| 5,469,378 A | 11/1995 | Albon et al. | |
| 5,485,418 A | 1/1996 | Hiraki et al. | 365/49 |
| 5,490,102 A | 2/1996 | Jubran | 365/49 |
| 5,491,703 A | 2/1996 | Barnaby et al. | |
| 5,513,134 A | 4/1996 | Cooperman et al. | 365/49 |
| 5,517,441 A | 5/1996 | Dietz et al. | 365/49 |
| 5,568,415 A | 10/1996 | McLellan et al. | |
| 5,598,115 A | 1/1997 | Holst | |
| 5,642,114 A | 6/1997 | Komoto et al. | 341/67 |
| 5,699,288 A | 12/1997 | Kim et al. | |
| 5,706,224 A | 1/1998 | Srinivasan | 365/49 |
| 5,724,296 A | 3/1998 | Jang | |
| 5,841,874 A * | 11/1998 | Kempke et al. | 380/50 |
| 5,860,085 A * | 1/1999 | Stormon et al. | 711/108 |
| 5,870,324 A | 2/1999 | Helwig et al. | |
| 5,893,137 A * | 4/1999 | Parks et al. | 711/108 |
| 5,920,886 A * | 7/1999 | Feldmeier | 711/108 |
| 5,930,359 A | 7/1999 | Kempke et al. | |
| 5,933,363 A | 8/1999 | Shindo | |
| 5,940,852 A | 8/1999 | Rangasayee et al. | 711/108 |
| 5,949,696 A | 9/1999 | Threewitt | 365/49 |
| 6,014,732 A * | 1/2000 | Naffziger | 711/203 |
| 6,137,707 A * | 10/2000 | Srinivasan et al. | 365/49 |
| 6,154,384 A * | 11/2000 | Nataraj et al. | 365/49 |
| 6,181,698 B1 * | 1/2001 | Hariguchi | 370/392 |

OTHER PUBLICATIONS

Advanced Micro Devices, "Final Am99C10A 256×48 Content Addressable Memory" Publication No. 08125, Rev. G, Dec. 1992, pp. 1–21.

Music Semiconductors, "MU9C2480 LANCAM Preliminary Data Sheet", Aug. 25, 1995, pp. 1–24.

GEC Plessey Semiconductors Preliminary Information, "2800 2K×64 Bit Multi–Port Content Addressable Memory", Feb. 1997, pp. 1–15.

Music Semiconductor, "The MU9C1480 LANCAM Handbook", Rev. 3, Nov. 1994, pp. 1–1 through 7–12.

Music Semiconductors, "MU9C1480 LANCAM" Advanced Information, Mar. 22, 1990, pp. 1–11.

KLSI, "Address Processor", KE5B064H series–Dual Port and Fixed Table Type–, Version 1.0.1, published approximately late 1995 or early 1996, pp. 1–1 through 14–1.

KLSI, "KE5B064A1 Addressable Processor", Version 2.0.2, published approximately late 1995 or early 1996, pp. 1–1 through 12–1.

Music Semiconductors, "MUAA™ CAM Family" Advanced Information, Feb. 24, 1998, Rev. O, pp. 1–16.

Soo–Ik Chae et al., "Content–Addressable Memory for VLSI Pattern Inspection", IEEE Journal of Solid State Circuits, vol. 23, No. 1, Feb. 1998, pp. 74–78.

Yong–Chul Shin et al., "A Special–Purpose Content Addressable Memory Chip for Real–Time Image Processing", IEEE Journal of Solid–State Circuits, vol. 27, No. 5, May 1992, pp. 737–744.

Sergio R. Ramirez–Chavez, "Encoding Don't Cares in Static and Dynamic Content–Addressable Memories", Transaction Briefs, IEEE Transactions on Circuits and System–II: Analog and Digital Signal Processing, vol. 39, No. 8, Aug. 1992, pp. 575–578.

Ian N. Robinson, Hewlett–Packard Laboratories, "Pattern–Addressable Memory", Jun. 1992, pp. 20–30.

Keikichi Tamaru, "The Trend of Functional Memory Development", Invited Paper Special Issue on LSI Memories, IEICE Trans. Electron., vol. E76–C, No. 11, Nov. 1993, pp. 1545–1554.

Takeshi Ogura et al., "A 4–kbit Associative Memory LSI", IEEE Journal of solid–State Circuites, vol. SC–20, No. 6, Dec. 1985, pp. 1277–1281.

Hiroshi kadota et al., "An 8–kbit Content–Addressable and Reentrant Memory", IEEE Journal of Solid–State Circuits, vol. SC–20, No. 5, Oct. 1985, pp. 951–956.

Simon R. Jones et al., "A 9–kbit Associative Memory for High–speed Parallel Processing Applications", IEEE Journal of Solid–State Circuits, vol. 23, No. 2, Apr. 1988m pp., 543–548.

Anthony J. McAuley et al., "A Self–Testing Reconfigurable CAM", IEEE Journal of Solid–State Circuits, vol. 26, No. 3, Mar. 1991, pp. 257–261.

Landrock et al., "Associative Storage Module", IBM Technical Disclosure Bulletin, vol. 25, No. 5, Oct. 1982, pp. 2341–2342.

PCT International Search Report—International Application No.: PCT/US 98/21853, International Filing Date Oct. 14, 1998.

Masao Akata, "A Scheduling Content–Addressable Memory for ATM Space–Division Switch Control", IEEE International Solid State Circuits Conference, Feb. 1991, New York.

Ghose et al., "Response Pipelined CAM Chips: The First Generation and Beyond", 7$^{th}$ International conference on VLSI Design, Jan. 1994, pp. 365–368.

Masao Akata, et al. *A Scheduling Content–Addressable Memory for ATM Space–Division Switch Control*, ISSCC '91, Session 14, Telecommunication Circuits (Feb. 1991), 3 pgs.

* cited by examiner

| Bit 63 ... Bit 52 | Bit 51 ... Bit 40 | Bit 39 ... Bit 37 | Bit 36 | Bit 35 | Bit 34 | Bit 33 | Bit 32 | Bit 31 ... Bit 0 |
|---|---|---|---|---|---|---|---|---|
| Match Address | Device ID | Reserved | MF | MMF | FF | Skip | Empty | Data from Cam Array 104 |

FIG. 10

| Bit 63 ... Bit 52 | Bit 51 ... Bit 48 | Bit 47 ... Bit 0 |
|---|---|---|
| Match Address | Device ID | Data from Cam Array 104 |

FIG. 11

TERNARY CONTENT ADDRESSABLE MEMORY WITH COMPARE OPERAND SELECTED ACCORDING TO MASK VALUE

CROSS-REFERENCE TO RELATED APPLICATIONS

This is a continuation-in-part of U.S. application Ser. No. 08/967,314 filed on Oct. 30, 1997 and entitled "SYNCHRONOUS CONTENT ADDRESSABLE MEMORY WITH SINGLE CYCLE OPERATION", now U.S. Pat. No. 6,199,140.

FIELD OF THE INVENTION

The present invention relates generally to content addressable memory (CAM) devices.

BACKGROUND

A content addressable memory (CAM) device is a storage device that can be instructed to compare a specific pattern of comparand data with data stored in its associative CAM array. The entire CAM array, or segments thereof, are searched in parallel for a match with the comparand data. If a match exists, the CAM device indicates the match by asserting a match flag. Multiple matches may also be indicated by asserting a multiple match flag. The CAM device typically includes a priority encoder to translate the matched location into a match address or CAM index and outputs this address to a status register.

Each CAM cell conventionally includes a comparator and a random access memory (RAM) element. The CAM array may be partitioned into separate segments in which one segment stores CAM or compare data to be compared with the comparand data, and another segment stores associated RAM data corresponding to each of the CAM or compare locations. Once a match between the CAM data and the comparand data is determined, the associated RAM data for the matched location may be output to a status register. The RAM data and/or the CAM data may then be read from the status register.

Conventional CAM devices require more than one clock cycle to perform a write and compare instruction. For example, a typical write and compare instruction requires at least three clock cycles: a first clock cycle to present a compare instruction and/or comparand data to the CAM device, perform the search, and generate a match flag and multiple match flag signal; a second clock cycle to instruct the CAM device to output the matching CAM address or index; and, a third clock cycle to instruct the CAM device to output the associated data and status information (e.g., skip bit, empty bit, full flag, as well as, match and multiple match flags) for the matched location. With conventional cycle times generally running at 100 nanoseconds (ns), it requires at least 300 ns to complete this process. This generally limits the search rate of conventional CAM devices to approximately 1 to 3 million searches per second. This also generally limits the number of ports, segments, or devices that can be supported by a conventional CAM device in a switch or router environment.

The multi-clock cycle process has generally been required due to the architecture of conventional CAM devices. Most CAM devices include a general purpose bi-directional bus that keeps the pin count of the CAM devices to a minimum (e.g., 44 pins). The bi-directional bus is used to load comparand data and instructions into the CAM device. The bi-directional bus is also used to output the matched address, associated data, and status bits from a status register in the CAM device. Because this bus is shared with so many input and output functions, it requires many clock cycles to multiplex data on the bus.

CAM devices that have separated the general purpose bi-directional bus into a data input bus and a data output bus, still require at least three clock cycles to perform the write and compare operation described above, namely: one clock cycle to load the write and compare instruction and/or load the comparand data and perform the comparison with CAM array; one clock cycle to access the associated data; and, one clock cycle to instruct the CAM device to output the match address, associated data, and/or status information.

As applications for CAM devices increase in speed, there has been a desire for faster CAM devices that have shorter search times, or preferably, can execute a write and compare instruction in a fewer number of clock cycles. For example, it is desirable to have a CAM device that can be used as an address filter or address translator in an ethernet switch or router that operates at data rates of 100 Megabits per second (Mb/s) to 1 Gigabits per second (Gb/s). It is also desirable to have a CAM device that can be used to implement fast routing tables in Internet Protocol (IP) switches. As the number of ports, segments, or devices that are supported by the switches or routers increases, the time required for the supporting CAM device to perform a write and compare operation (e.g., address filter or translation operation) decreases. For example, to support a 1 Gb/s ethernet switch, a CAM device supporting approximately three ports should advantageously be able to perform a single write and compare instruction in approximately 100 ns or faster. A CAM device supporting approximately six ports should advantageously be able to perform a single write and compare instruction in approximately 50 ns or faster.

SUMMARY OF THE INVENTION

A content addressable memory (CAM) device is disclosed. The CAM device is a synchronous device that may perform all of the following operations in one clock cycle: (1) receive comparand data from a comparand bus; (2) receive an instruction from an instruction bus instructing the CAM device to compare the comparand data with a first group of CAM cells in a CAM array; (3) perform the comparison of the comparand data with the first group of CAM cells; (4) generate a match address for a location in the CAM array that stores data matching the comparand data; (5) access data stored in a second group of CAM cells in the CAM array, wherein the second group of CAM cells may store data associated with the matched location; and (6) output to an output bus the match address, the data stored in the second group of CAM cells, and/or status information corresponding to the matched address or the second group of CAM cells. The status information may include a match flag, multiple match flag, full flag, skip bit, empty bit, or a device identification for the CAM device. The CAM array may also include ternary CAM cells that are individually maskable so as to effectively store either a logic one, logic zero, or a don't care state for compare operations.

Other objects, features, and advantages of the present invention will be apparent from the accompanying drawings and from the detailed description which follows below.

BRIEF DESCRIPTION OF THE DRAWINGS

The features and advantages of the present invention are illustrated by way of example and are by no means intended to limit the scope of the present invention to the particular embodiments shown, and in which:

FIG. 10 is one embodiment of the signals output onto the ADS BUS of FIG. 1;

FIG. 11 is another embodiment of the signals output onto the ADS BUS of FIG. 1;

DETAILED DESCRIPTION

Figure 1:
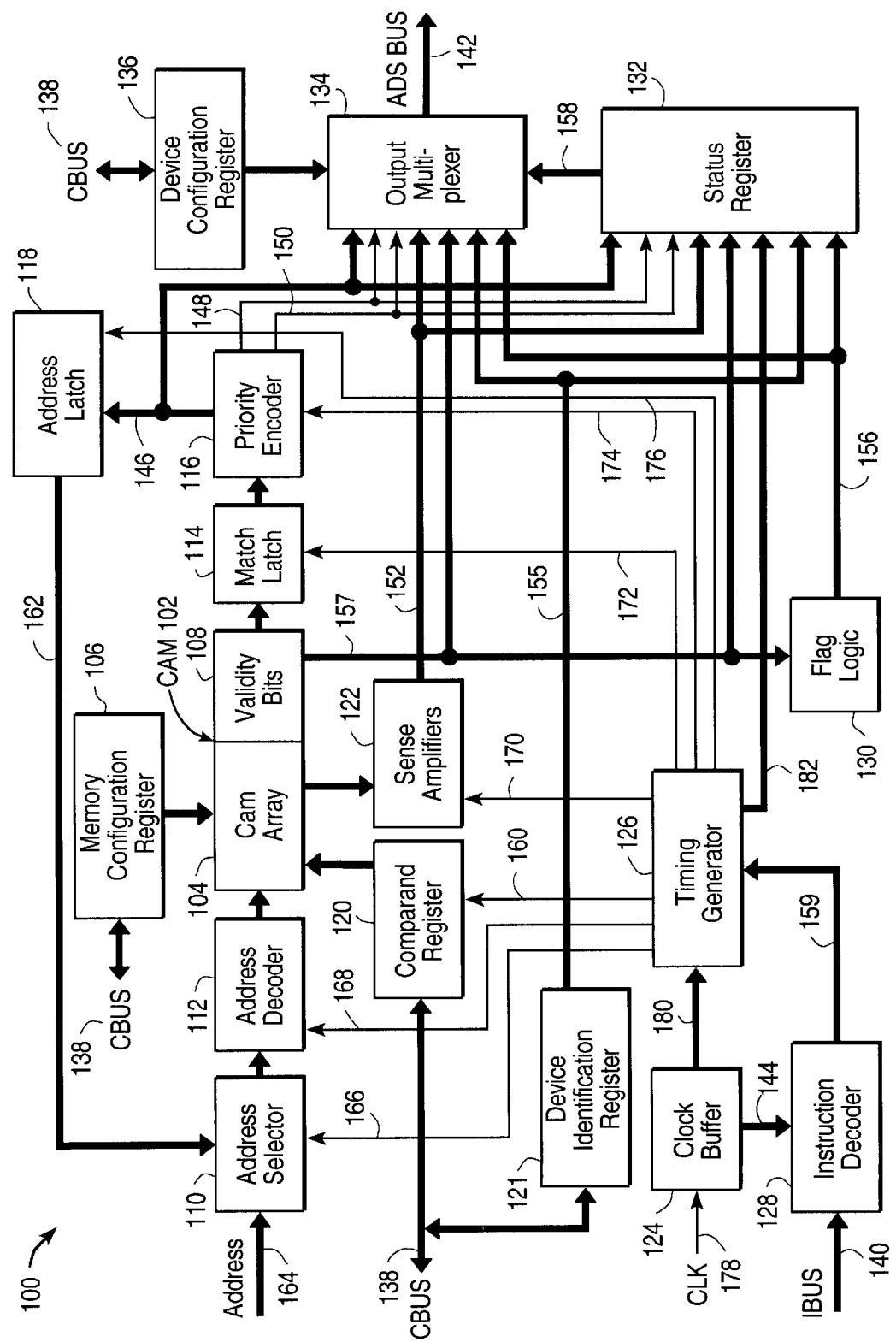
FIG. 1 is a block diagram of one embodiment of a CAM device according to the present invention.

A content addressable memory (CAM) device is disclosed. In the following description, for purposes of explanation, specific nomenclature is set forth to provide a thorough understanding of the present invention. However, it will be apparent to one skilled in the art that these specific details may not be required to practice the present invention. In other instances, well known circuits and devices are shown in block diagram form to avoid obscuring the present invention unnecessarily. Additionally, the interconnection between circuit elements or blocks may be shown as buses or as single signal lines. Each of the buses may alternatively be single signal lines, and each of the single signal lines may alternatively be buses.

The CAM device of the present invention is a synchronous device that has an instruction bus for receiving instructions, a separate comparand bus for receiving comparand data to be compared with one or more CAM cells of a CAM array, and a separate associated data and status bits bus. The associated data and status bits bus may simultaneously or individually output: a match address or CAM index for a location of the CAM array that matches the comparand data; data stored in one or more of the CAM cells of the CAM array, wherein the data is associated with the matched address; and status information corresponding to the matched address or associated data. The status information may include a match flag, multiple match flag, full flag, skip bit, empty bit, or device identification information for the CAM device.

The CAM device may perform, in a single clock cycle (i.e., a flow through mode), a write and compare instruction that causes the CAM device to: (1) receive comparand data from the comparand bus; (2) receive an instruction from the instruction bus instructing the CAM device to compare the comparand data with a first group of CAM cells in a CAM array; (3) perform the comparison of the comparand data with the first group of CAM cell(s); (4) generate a match address if a location in the CAM array stores data matching the comparand data; (5) access data stored in a second group of CAM cells corresponding to the matched location in the CAM array, wherein the accessed data is associated with the matched address; and (6) output the matched address, the data stored in the second group of CAM cells, and/or the status information to associated data and status bits bus.

The single cycle may have any cycle time. For one embodiment, the single cycle time may be approximately 25 ns and the CAM device may have a search rate of approximately 35 to 45 million searches per second. Thus, the present invention may be very useful in a high-speed (e.g., 100 Mb/s or 1 Gb/s) network bridge or router environment. For example, the CAM device of the present invention may support eight or more ports, segments, or devices in a high-speed ethernet switch or router environment having, for example, a data rate of 1 Gb/s. The CAM device of the present invention may store destination addresses of data packets sent between the segments, ports, or devices in the network.

FIG. 1 shows CAM device 100 according to one embodiment of the present invention. CAM device 100 includes three separate ports coupled to three separate buses. The first port is coupled to a comparand bus (CBUS) 138 that may be a bi-directional bus used to provide comparand data to comparand register 120. CBUS 138 may also be used to access device configuration register 136, status register 132, device identification register 121, memory configuration register 106, CAM 102, and one or more mask registers (not shown). CBUS 138 may be any size to accommodate any number of bits. For one embodiment, CBUS 138 is a 64-bit bus. The first port may have input buffers or registers coupled to CBUS 138.

The second port is coupled to an instruction bus (IBUS) 140 that is used to provide instructions to instruction decoder 128. Instructions may be clocked into instruction decoder 128 from IBUS 140 by one or more clock signals output from clock buffer 124 to bus 144. IBUS 140 may be any size to accommodate any number of bits and any number of instructions. For one embodiment, IBUS 140 is 14 bits wide to accommodate 2^14 unique possible binary coded instructions. Other encodings may be used. The second port may have input buffers or registers coupled to IBUS 140.

Clock buffer 124 may buffer the external clock signal CLK 178 and provide one or more clock signals to timing generator 126 via bus 180, and may provide one or more clock signals to instruction decoder 128 via bus 144. Clock buffer 124 may also generate clock signals having varying phases and frequencies.

The third port is coupled to an associated data and status bit bus (ADS BUS) 142 that may output matched address data, data from CAM array 104 corresponding to the matched address, and/or status information. ADS BUS 142 may be any size to accommodate any number of bits. For one embodiment, ADS BUS 142 is a 64-bit bus. The third port may have output buffers or registers coupled to ADS BUS 142.

Output multiplexer 134 provides data to ADS BUS 142. Output multiplexer 134 may include output buffers, one or more multiplexers, a selector circuit, registers, or latches. Output multiplexer 134 may receive a matching CAM address or index from priority encoder 116 via bus 146, and may also receive data stored in CAM array 104 via sense amplifiers 122 and bus 152. Additionally, output multiplexer 134 may receive status information including a match flag signal (MF) from priority encoder 116 via line 148, a multiple match flag signal (MMF) from priority encoder 116 via line 150, a full flag signal (FF) from flag logic 130 via line 156, device identification information from device identification register 121 via bus 155, and/or validity bits 108 via bus 157. The status information will be described in more detail below. Output multiplexer 134 may alternatively or additionally receive the matching CAM address, data stored in CAM array 104 corresponding to the matching CAM address, and/or the status information from status register 132 via bus 158. Configuration register 136 may store one or more programmable bits that may control whether output multiplexer 134 outputs the matching CAM address, CAM array data, and status information from status register 132 (e.g., in a pipelined mode) or from the other circuit elements (e.g., in a single cycle flow through mode). Status register 132 may comprise one or more registers.

CAM device 100 may also include flag logic 130 that may generate a full flag (FF) signal on lines 156 in response to validity bits 108 on bus 157. Flag logic 130 may also generate a match flag signal and a multiple match flag signal on lines 156. The flag(s) may be coupled to output multiplexer 134 and/or status register 132.

CAM device 100 may also include device identification register 121 that may store device identification information that identifies CAM device 100 from other CAM devices in a system. The device identification information may comprise any number of bits or signals. For one embodiment, the device identification information is 16 bits of binary encoded information. Any other encoding format may be used. The device identification information may also be provided to status register 132.

CAM device 100 also includes CAM 102. CAM 102 includes a CAM array 104 that may be organized in any number of rows and columns of CAM cells. CAM 102 may also include validity bits 108 that store information about corresponding locations in CAM array 104. For example, the validity bits for a given row or location in CAM array 104 may include a skip bit and an empty bit. The skip bit may indicate that a particular location in CAM array 104 should be skipped when performing a compare operation with comparand data stored in comparand register 120. The empty bit may indicate that a corresponding location in CAM array 104 is empty. The validity bits also group the CAM cells into four states as indicated in Table 1. A comparison operation may compare comparand data against any of the locations in CAM array 104 that correspond to a given state.

TABLE 1

| SKIP | EMPTY | STATE |
|------|-------|-------|
| 0 | 0 | VALID |
| 0 | 1 | EMPTY |

TABLE 1-continued

| SKIP | EMPTY | STATE |
|------|-------|-------|
| 1 | 0 | SKIP |
| 1 | 1 | RAM |

Validity bits 108 may be provided (e.g., through sense amplifiers) to output multiplexer 134, status register 132, and/or flag logic 130 via bus 157. Alternatively, validity bits 108 may be generated or decoded in response to a decoded instruction output by instruction decoder 128.

Figure 2:
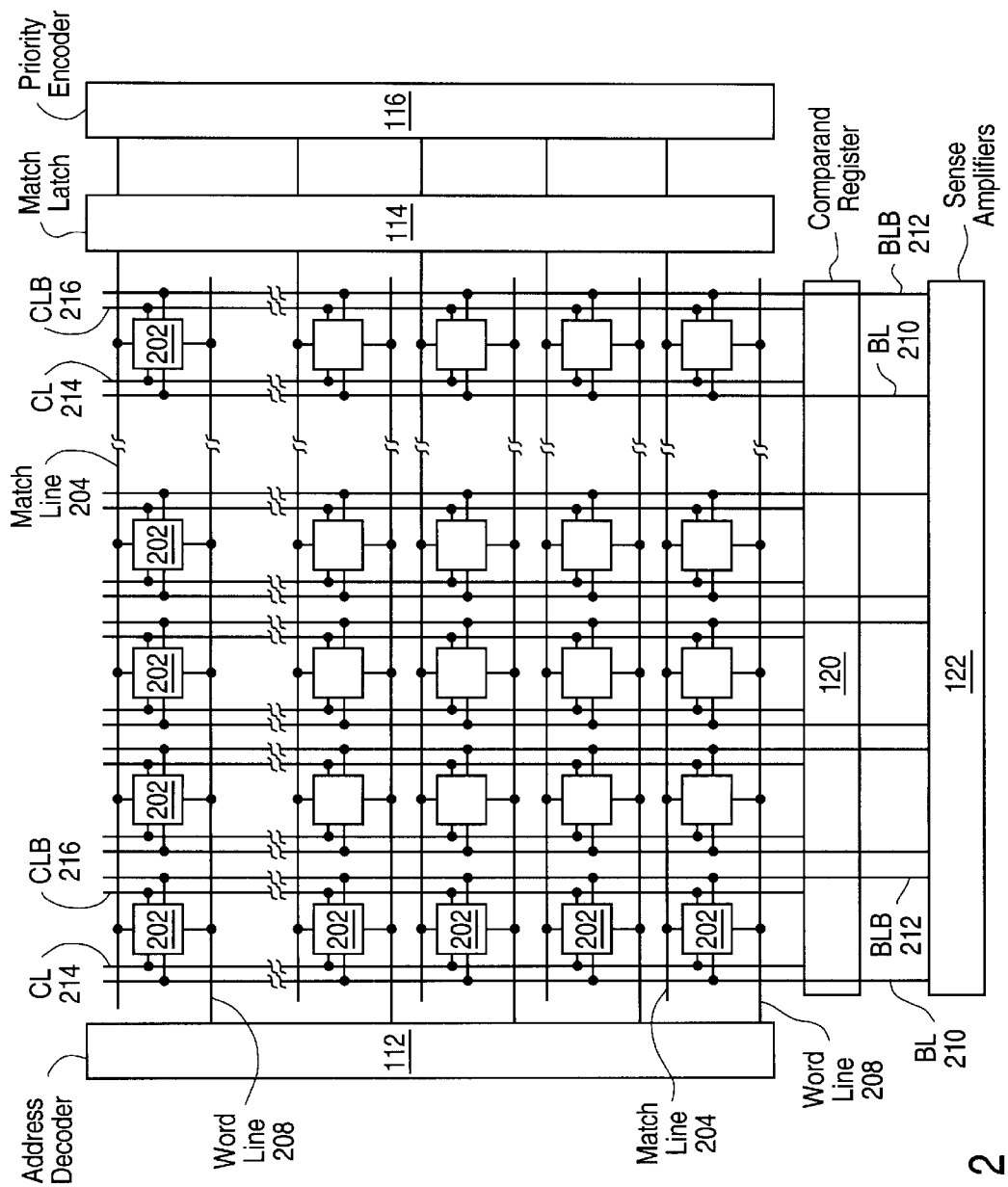
FIG. 2 is block diagram of one embodiment of the CAM array of FIG. 1.

FIG. 2 shows one embodiment of CAM array 102 having a plurality of CAM cells 202 organized in any number of rows and columns. For one embodiment, CAM array 102 may include approximately 4 k (i.e., 4096) rows and approximately 64 columns of CAM cells 202. For another embodiment, CAM array 102 may include approximately 2 k (i.e., 2048) rows and approximately 128 columns of CAM cells 202. The validity bits may also be included in additional rows and columns of CAM cells 202.

Each row of CAM cells 202 is coupled to a match line 204 and a word line 208. Each word line 208 is driven by address decoder 112 to select one or more of CAM cells 202 for writing or reading. Each match line 204 is coupled to match latch 114 that latches the match results of a comparison operation. An individual match line will indicate a match only if all of the CAM cells 202 (actually compared) in that row match the comparand data. The latch results are then provided to priority encoder 116 which generates an address corresponding to at least one of the matched locations. For one embodiment, the matched address is the highest priority match address. The highest priority match address may be the lowest numbered address, the highest numbered address, or any other selected address. Alternatively, the match address may be the lowest priority match address, or any other predetermined priority.

Each column of CAM cells is coupled to a bit line (BL) 210, a complementary bit line (BLB) 212, a compare line (CL) 214, and a complementary compare line (CLB) 216. BL 210 and BLB 212 are coupled to sense amplifiers 122 that may enable data to be read from or written to CAM cells 202. CL 214 and CLB 216 are coupled to comparand register 120 and provide comparand data to CAM cells 202 for comparison purposes. For alternative embodiments, any other CAM array architecture may be used. For example, CAM array 102 may not include CL 214 and CLB 216; rather, BL 210 and BLB 212 may be coupled to comparand register 120 and may be used to perform a comparison with data stored in CAM cells 202 as generally known in the art. For example, in the first part of a compare cycle, compare data may be provided onto BL 210 and BLB 212 from comparand register 120. In the second part of the compare cycle, BL 210 and BLB 212 may be driven with data to be output from CAM array 104.

Figure 3:
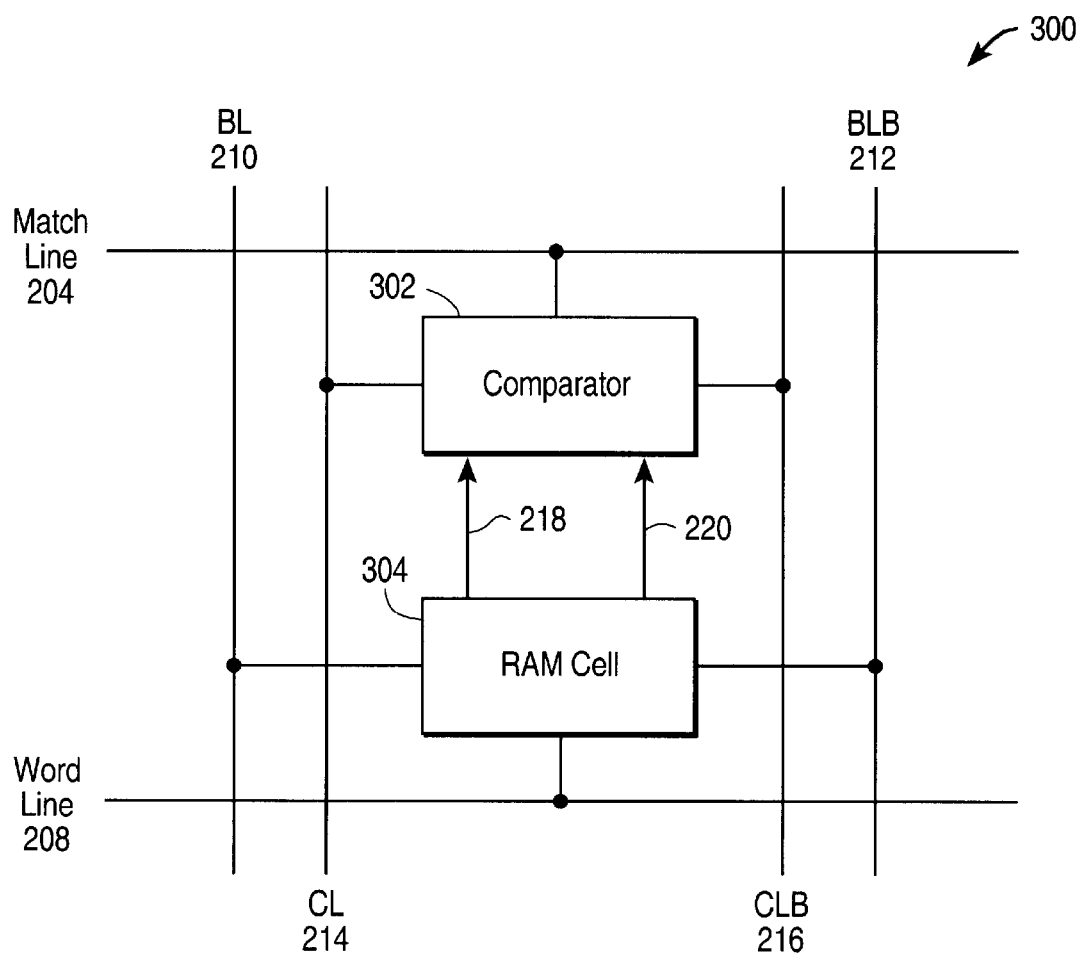
FIG. 3 is a block diagram of one embodiment of a CAM cell.

FIG. 3 shows CAM cell 300 that is one embodiment of a CAM cell 202. CAM cell 300 includes comparator 302 and RAM cell 304. RAM cell 304 is coupled to BL 210, BLB 212, and word line 208, and may be any type of RAM cell. When RAM cell 304 is selected by word line 208, data may be read from or written to RAM cell 304 via bit lines BL 210 and BLB 212. Comparator 302 is coupled to RAM cell 304, CL 214, CLB 216, and match line 204. Comparator 302 may compare data from comparand register 120 (supplied on CL 214 and CLB 216) with data stored in RAM cell 304 (supplied on lines 218 and 220). Comparator 302 may output the comparison result to match line 204. Comparator 302 may be any type of comparison circuit including an exclusive OR (XOR) or exclusive NOR (XNOR) gate. The comparison and read functions of CAM cell 300 may be performed simultaneously or sequentially. In alternative embodiments (e.g., CL 214 and CLB 216 omitted), the comparison and read functions may be performed sequentially. It will be appreciated that numerous other CAM cells may be used for CAM cells 202.

Figure 4:
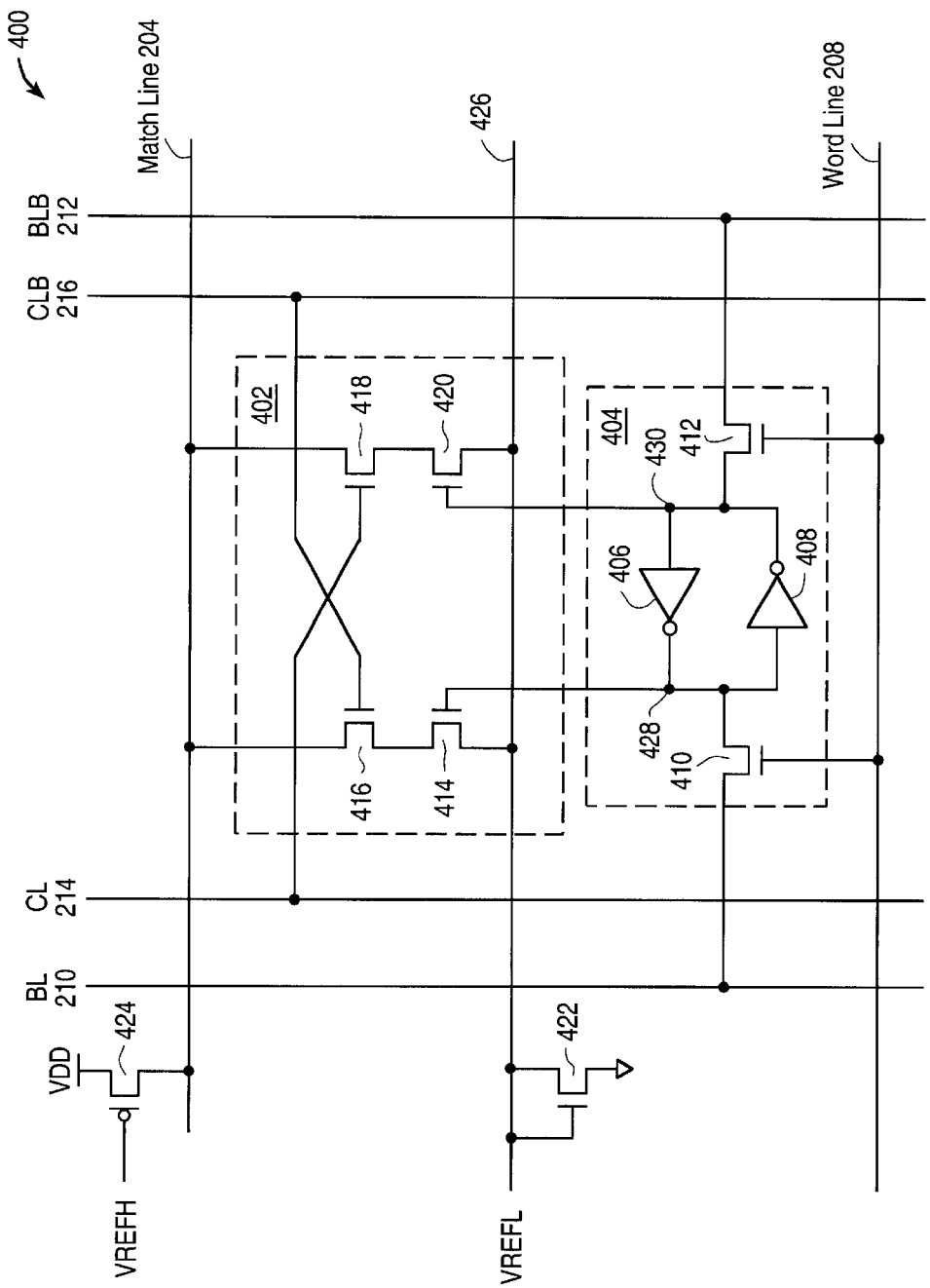
FIG. 4 is one embodiment of the CAM cell of FIG. 3.

FIG. 4 shows CAM cell 400 that is one embodiment of CAM cell 300 of FIG. 3 and/or one embodiment of a CAM cell 202 of FIG. 2. It will be appreciated that other CAM cells may be used to form CAM cell 300 and/or CAM cell 202. CAM cell 400 includes a RAM cell 404 and a comparator 402. RAM cell 404 includes cross-coupled inverters 406 and 408 coupled to nodes 428 and 430. Inverters 406 and 408 may be any type of inverters including NMOS, PMOS, or CMOS inverters with active or passive loads. RAM cell 404 also includes pass gates 410 and 412. Pass gate 410 may be an NMOS transistor having its source (drain) coupled to node 428, its drain (source) coupled to BL 210, and its gate coupled to word line 208. Pass gate 412 may be an NMOS transistor having its source (drain) coupled to node 430, its drain (source) coupled to BLB 212, and its gate coupled to word line 208. When word line 208 is selected (e.g., pulled to a high logic state), pass gate 410 is enabled to transfer data between node 428 and BL 210, and pass gate 412 is enabled to transfer data between node 430 and BLB 212.

Comparator 402 includes transistors 414, 416, 418, and 420. Transistor 414 has its gate coupled to node 428, its source coupled to line 426, and its drain coupled to the source of transistor 416. Transistor 416 has its drain coupled to match line 204, and its gate coupled to CLB 216. Transistor 420 has its gate coupled to node 430, its source coupled to line 426, and its drain coupled to the source of transistor 418. Transistor 418 has its drain coupled to match line 204, and its gate coupled to CL 214. Line 426 may be driven to a voltage VREFL of approximately one threshold voltage above ground (e.g., from approximately 0.6 volts to approximately 0.8 volts) due to the diode configuration of NMOS transistor 422 having its source coupled to ground, and its drain and gate coupled to line 426. One transistor 422 may be used for more than one CAM cell in CAM array 104. Alternatively, VREFL may be driven to approximately zero volts to approximately one volt by a reference voltage generator or other circuitry. For an alternative embodiment, line 426 may be directly connected to ground.

CAM cell 400 may also include PMOS transistor 424 that may pull match line 204 towards VDD when there is no match between data stored in RAM cell 404 and comparand data provided on compare lines CL 214 and CLB 216. PMOS transistor 424 has its source coupled to VDD, its drain coupled to match line 204, and its gate coupled to a reference voltage VREFH. VREFH may be approximately one threshold drop below VDD (e.g., approximately 0.6 to 0.8 volts below VDD). Alternatively, VREFH may be other voltages. VDD may be any supply voltage. For example, VDD may be from approximately 2.7 volts to approximately 7.0 volts.

The operation of CAM cell 402 may be illustrated as follows. Assume that RAM cell 404 stores a high logic state (a one) at node 428 causing transistor 414 to be on. The cross-coupled nature of inverters 406 and 408 will cause a low logic state (a zero) to be stored at node 430 turning off transistor 420. During a compare operation, if the comparand data is also high (CL 214 high), then CLB 216 will be driven low causing transistor 416 to turn off. Therefore, if there is a match between the comparand data and the data stored by RAM cell 404, match line 204 will remain in a high state. If, however, the comparand data is low (CL 214 low), then CLB 216 is driven high causing transistor 416 to be on and match line 204 to be pulled towards the potential of line 426 via transistors 414 and 416. Therefore, if there is no match between the comparand data and the data stored by RAM cell 404, match line 204 will be pulled to a low state.

Similarly, if RAM cell 404 stores a low logic state at node 428, transistor 414 will be off, and transistor 420 will be on. During a compare operation, if the comparand data is also low, then CL 214 will be driven low causing transistor 418 to turn off. Therefore, if there is a match between the comparand data and the data stored by RAM cell 404, match line 204 will remain in a high state. If, however, the comparand data is high, then CL 214 is driven high causing transistor 418 to be on and match line 204 to be pulled towards the potential of line 426 via transistors 418 and 420. Therefore, if there is no match between the comparand data and the data stored by RAM cell 404, match line 204 will be pulled to a low state.

Because of the separate bit lines and compare lines, CAM cell 400 may perform a comparison operation at the same time that data is read from RAM cell 404. That is, data may be compared on lines CL 214 and CL 216 with nodes 428 and 430 at the same time that data is read from nodes 428 and 430 to BL 210 and BLB 212, respectively. This may be advantageous in performing compare operations in CAM devices such as CAM device 100 of FIG. 1.

With respect to FIG. 2, CAM array 104 may store associative memory data or compare data (e.g., port address, pattern recognition keys, etc.) in any number of CAM cells 202 in a given row of CAM cells. The compare data may be compared with comparand data stored in comparand register 120. Similarly, CAM array 104 may store associated data or RAM data (e.g., bridge or switch port address, access information, or aging data) in any number of CAM cells 202 in a given row of CAM cells. The associated data may correspond to, or be associated with, other CAM cells in the same row that store compare data. The CAM cells 202 may be partitioned with a granularity of one into compare data and associated data segments. The compare data and associated data segments may be interleaved, or they may be non-interleaved segments.

For one embodiment, memory configuration register 106 may be used to program which bits in CAM array 104 are used to store compare data, and which bits are used to store associated data or other information. Memory configuration register 106 may thus act as a mask register indicating which CAM cells 202 (e.g., that may store compare data) will participate in a compare operation with comparand data, and which bits (e.g., that may store associated data or any other information) will not participate in a comparison operation with comparand data. For example, memory configuration register 106 may include one or more programmable bits corresponding to each column of CAM cells in CAM array 104. Each bit may be programmed via CBUS 138.

Data stored in CAM array 104 may be output (e.g., via sense amplifiers 122 and output multiplexer 134) in any order or in any format. For one embodiment, CAM array 104 may output its contents in multi-bit segments. Each segment may store compare data, associated data, and/or other information. For one example, CAM array 104 may be partitioned into four segments of 16 bits each. One or more of the segments may be sensed and output by output multiplexer 134 in any order (e.g., $2^4$ or 16 possible ordered outputs). One or more bits in device configuration register 136 may be programmed via CBUS 138 to cause one or more multiplexers in output multiplexer 134 to output the desired order of the segments to ADS BUS 142. For example, programming a bit in device configuration register 136 may cause a first 16-bit segment to be output on the first sixteen lines of ADS BUS 142, and a second 16-bit segment to be output on the second sixteen lines of ADS BUS 142. For this example, the remaining signal lines of ADS BUS 142 may output a match address and status information as shown in FIG. 10. For another example, programming a bit in device configuration register 136 may cause a third 16-bit segment to be output on the first sixteen lines of ADS BUS 142, and a fourth 16-bit segment to be output on the second sixteen lines of ADS BUS 142.

Figure 5:
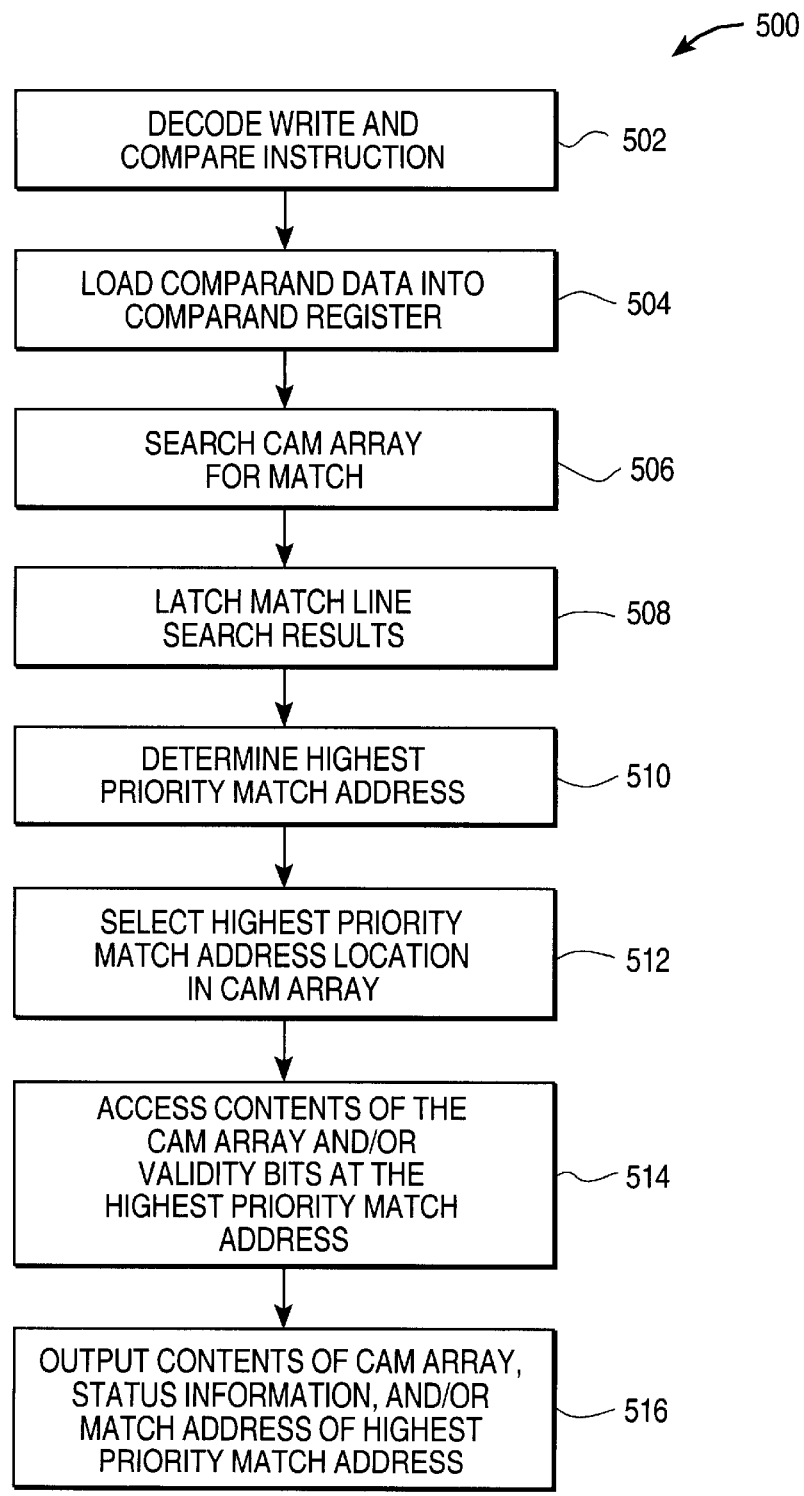
FIG. 5 is one embodiment of a method of performing a write and compare operation in a single clock cycle.

FIG. 5 describes one embodiment 500 of generally performing a write and compare instruction in CAM device 100 in one clock cycle of external clock signal CLK 178. At the start of the clock cycle, instruction decoder 128 decodes the write and compare instruction on IBUS 140 at step 502. In response to the instruction, comparand register 120 loads comparand data from CBUS 138 at step 504. Instruction decoder 128 may include a look-up table, a state machine, or any other control logic that can decode the write and compare or a compare instruction on IBUS 140.

At step 506, the comparand data in comparand register 120 is compared with data stored in CAM array 104 to determine if there is a match. The write and compare instruction decoded by instruction decoder 128 may instruct CAM device 100 to compare the comparand data against all entries, only valid entries (e.g., skip and empty bits inactive), entries where the skip bits are active, or entries where the skip bit and empty bits are active. The write and compare instruction may also instruct CAM device 100 to use one or more mask registers (not shown) to mask certain columns of CAM cells from the comparison. Alternatively, the decoded write and compare instruction may instruct CAM device 100 to compare the comparand data against associated data stored in CAM array 104. The write and compare instruction may be binary encoded on IBUS 140, or may be encoded in any other format. The comparison results of step 506 will be reflected by the state of the match lines 204 in CAM array 104.

At step 508, the states of the match lines in CAM array 104 are latched by match latch 114 and provided to priority encoder 116. At step 510, priority encoder 116 determines the highest priority match address from the comparison. Match latch 114 may be incorporated into priority encoder 116. The match address in then is output by priority encoder 116 to bus 146 and may be latched by address latch 118. Bus 146 couples the match address to output multiplexer 134 and status register 132 for output to ADS BUS 142. As generally known in the art, priority encoder 116 may also generate a match flag signal on line 148 if there is at least one match between the comparand data and the data stored in CAM array 104. Additionally, priority encoder 116 may also generate a multiple match flag signal on line 150 if there is at least two matches between the comparand data and the data stored in CAM array 104.

The match address on bus 162 is provided to address decoder 112 by address selector 110. Address selector 110 couples either the address on address bus 164 or the match address on bus 162 to address decoder 112 in response to a signal on line 166. Address bus 164 may be an internal bus within CAM device 100 (e.g., coupled to an address counter) or a bus external to CAM device 100. Address selector 110 may be a multiplexer. For an alternative embodiment, address selector 110 may be omitted and bus 162 may be directly connected to address decoder 112.

At step 512, address decoder 112 decodes the match address and selects one row of CAM cells in CAM array 104 corresponding to the match address. Address decoder 112 may also select the corresponding validity bits 108 for the selected row in CAM array 104. At step 514, one or more CAM cells at the highest priority match address are sensed by sense amplifiers 122 and coupled to bus 152 for output to ADS BUS 142 via output multiplexer 134. Additionally, the validity bits may be accessed and/or sensed (e.g., by sense amplifiers 122) and output to bus 157. At step 516, and before the end of the first clock cycle of external clock CLK 178, output multiplexer 134 may simultaneously or concurrently output to ADS BUS 142: the data read from CAM array 104 onto bus 152; the match address on bus 146; and/or, the status information (e.g., match flag signal on line 148, multiple match flag signal on line 150, full flag signal on line 156, the validity bits on bus 157, and/or device identification information from device identification register 121 on bus 155). For example, output multiplexer 134 may output the signals as illustrated in FIGS. 10 and 11.

Timing generator 126 outputs timing signals on lines 160, 166, 168, 170, 172, 174, 176, and 182 in response to one or more clock signals from clock buffer 124 and an indication of the write and compare instruction (or simply a compare instruction) from instruction decoder 128 on bus 159. The timing signals coordinate the operation of the various circuit elements to perform the write and compare instruction in one clock cycle.

Figure 6:
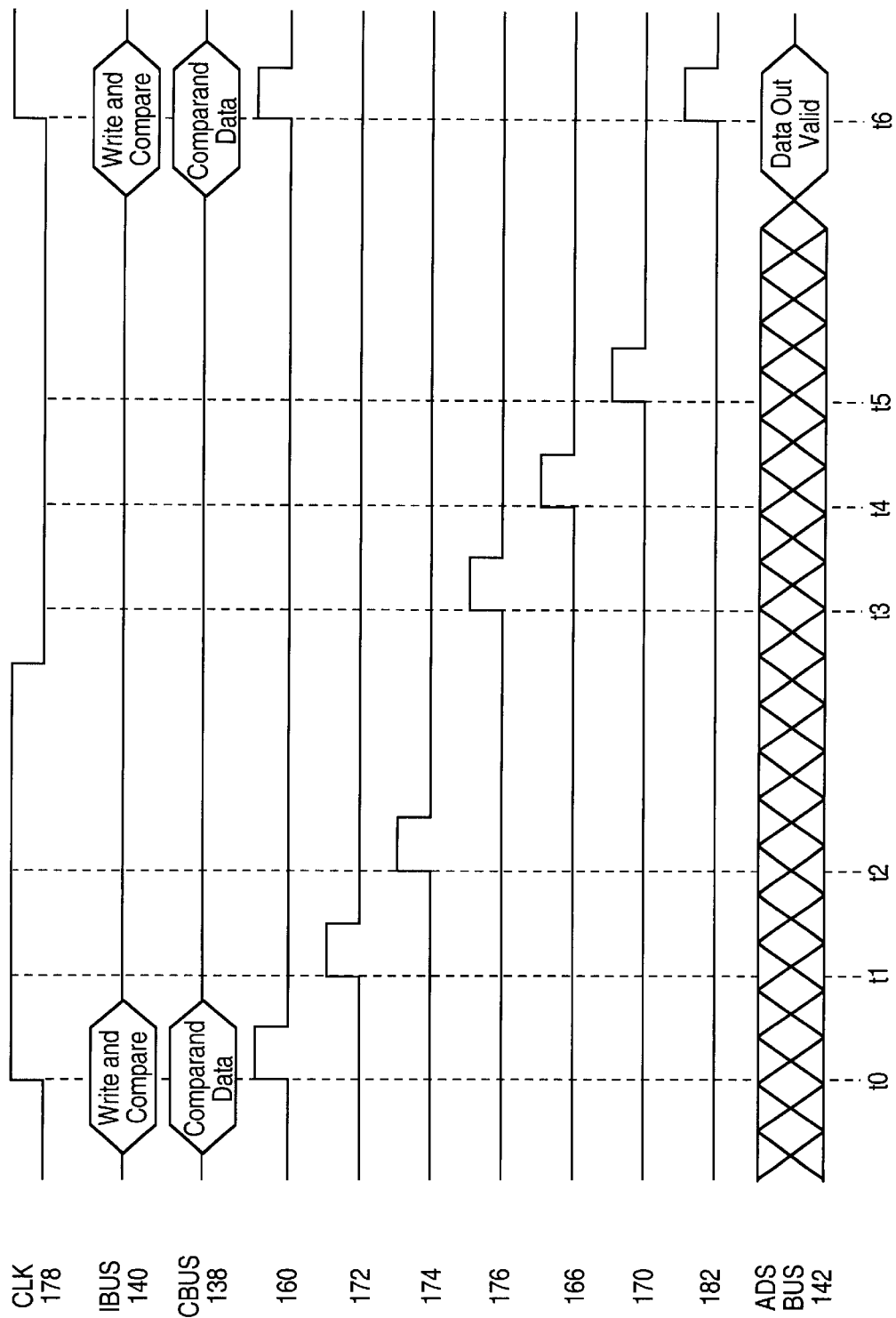
FIG. 6 is a timing diagram for one embodiment of the signals generated by the timing generator of FIG. 1.

FIG. 6 is an illustrative timing diagram showing one embodiment of the sequence of signals generated by timing generator 126 for a write and compare instruction. At time t0, the start of the clock cycle of CLK 178, instruction decoder 128 decodes the write and compare instruction on IBUS 140 and sends a signal on bus 159 to timing generator 126. In response, timing generator 126 sends a pulse signal on line 160 to cause the comparand data on CBUS 138 to be loaded into comparand register 120.

Between times t0 and t1, the comparand data is provided to CAM array 104 and compared against one or more CAM cells of CAM array 104 for a match. The match results reflected on the match lines of CAM array 104 are then coupled to match latch 114 and latched by the pulse generated at time t1 on line 172. The latched match signals are coupled to priority encoder 116.

At time t2, timing generator 126 generates a pulse on line 174 that causes priority encoder 116 to generate a match address for the highest priority matched location. The highest priority match address is output to bus 146. At time t3, timing generator 126 generates a pulse signal on line 176 that causes address latch 118 to latch the match address from priority encoder 116 and provide the latched match address to bus 162. For an alternative embodiment, the match address may be provided to address selector 110 without being latched by address latch 118.

At time t4, timing generator 126 generates a pulse signal on line 166 that causes optional address selector 110 to couple the match address on bus 162 to address decoder 112. Address decoder 112 may then decode the match address and select the row of CAM cells in CAM array 104 and/or the validity bits 108 that corresponds to the matched address. Address decoder 112 may alternatively be synchronous and start decoding the match address in response to the signal on line 166. Alternatively, address decoder 112 may start decoding the match address in response to a pulse signal on line 168. The pulse signal on line 168 may be generated coincident with the pulse signal on line 166, or after the pulse signal on line 166 but before the pulse signal on line 170.

Between times t4 and t5, sense amplifiers 122 sense the selected CAM cells of CAM array 104 (and/or the corresponding validity bits). At time t5, timing generator 126 then generates a pulse signal on line 170 that causes sense amplifiers 122 to latch the sensed data and couple this data to bus 152. This data may then be output by output multiplexer 134 to ADS BUS 142 by time t6 along with the match address from bus 146 and the status information (e.g., the validity bits 108, the match flag signal from line 148, the multiple match flag signal from line 150, the full flag signal on line 156, and/or the device identification on bus 155). A subsequent instruction (e.g., another write and compare instruction) may then begin at time t6.

Timing generator 126 may additionally generate one or more pulse signals on bus 182 at time t6 that causes status register 132 to load the match address from bus 146, the match flag signal from bus 148, the multiple match flag signal from line 150, the device identification information from bus 155, the sensed data CAM array data on bus 152, the full flag signal from line 156, and/or validity bits 108 from bus 157. The signals on bus 182 may alternatively be generated by instruction decoder 128.

The time differences between the pulses generated on lines 160, 172, 174, 176, 166, 170, and 182 are sufficient to allow the operations described above to function properly under anticipated, characterized, or specified process, temperature, and supply voltage ranges. For one embodiment, the clock cycle time (i.e., t6-t0) is approximately 25 ns, t1-t0 is approximately 4 ns, t2-t1 is approximately 2 ns, t3-t2 is approximately 5 ns, t4-t3 is approximately 2 ns, t5-t4 is approximately 4 ns, and t6-t5 is approximately 3 ns. For other embodiments, the time differences between the pulse signals may be different values.

The signals generated on lines 160, 172, 174, 176, 166, 170, and 182 are shown in FIG. 6 as pulse signals. For alternative embodiments, a rising or falling edge of a signal may be generated instead of a pulse signal. The pulse signals may also be programmable or adjustable to have any pulse width.

Figure 7:
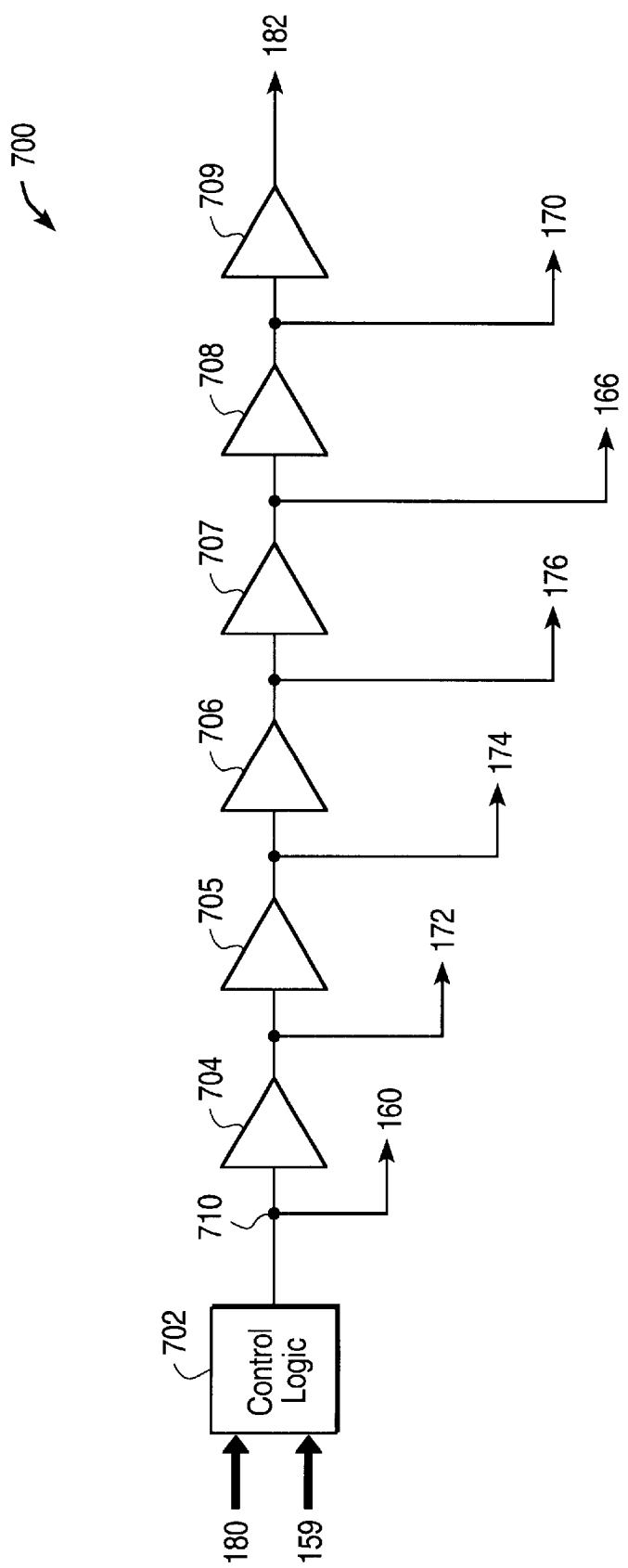
FIG. 7 is one embodiment of the timing generator of FIG. 1.

Timing generator 126 may be any timing generator circuit that generates the pulses on lines 160, 172, 174, 176, 166, 170, and 182 at the appropriate times. FIG. 7 shows timing generator 700 that is one embodiment of timing generator 126 of FIG. 1. Timing generator 700 includes control logic 702 that receives one or more clock signals on bus 180 from clock buffer 124, and an indication of the write and compare instruction from instruction decoder 128 on bus 159. Control logic 702 may be a pulse generator circuit that generates a pulse signal on line 710 that may be coupled to line 160. The pulse signal on line 710 may be delayed by a series of delay elements 704, 705, 706, 707, 708, and 709 that may be used to generate the pulse signals on lines 172, 174, 176, 166, 170, and 182, respectively. Delay elements 704–709 may include, for example, resistors, capacitors, transistor pass gates, inverting buffers, and/or non-inverting buffers. Each delay element may also include a programmable element that enables a user or manufacturer to program the delay of each of the delay elements so that the pulses on lines 172, 174, 176, 166, 170, and 182 may be generated at the appropriate times. The programmable elements may also program the pulse width of one or more of the signals 172, 174, 176, 166, 170, and 182.

For an alternative embodiment, clock buffer 124 may generate a plurality of signals at different times, and timing generator 126 may include circuitry that selectively enables each of the clock signals to be coupled to lines 160, 172, 174, 176, 166, 170, and 182 at the appropriate time.

For still another embodiment, clock buffer 124 may generate a clock signal on bus 180 that has a frequency that is n times the frequency of CLK 178, where n is greater than one. Timing generator 126 may be a state machine or counter that consecutively generates the signals on lines 160, 172, 174, 176, 166, 170, and 182 once per clock cycle of the clock signal on bus 180.

Figure 8:
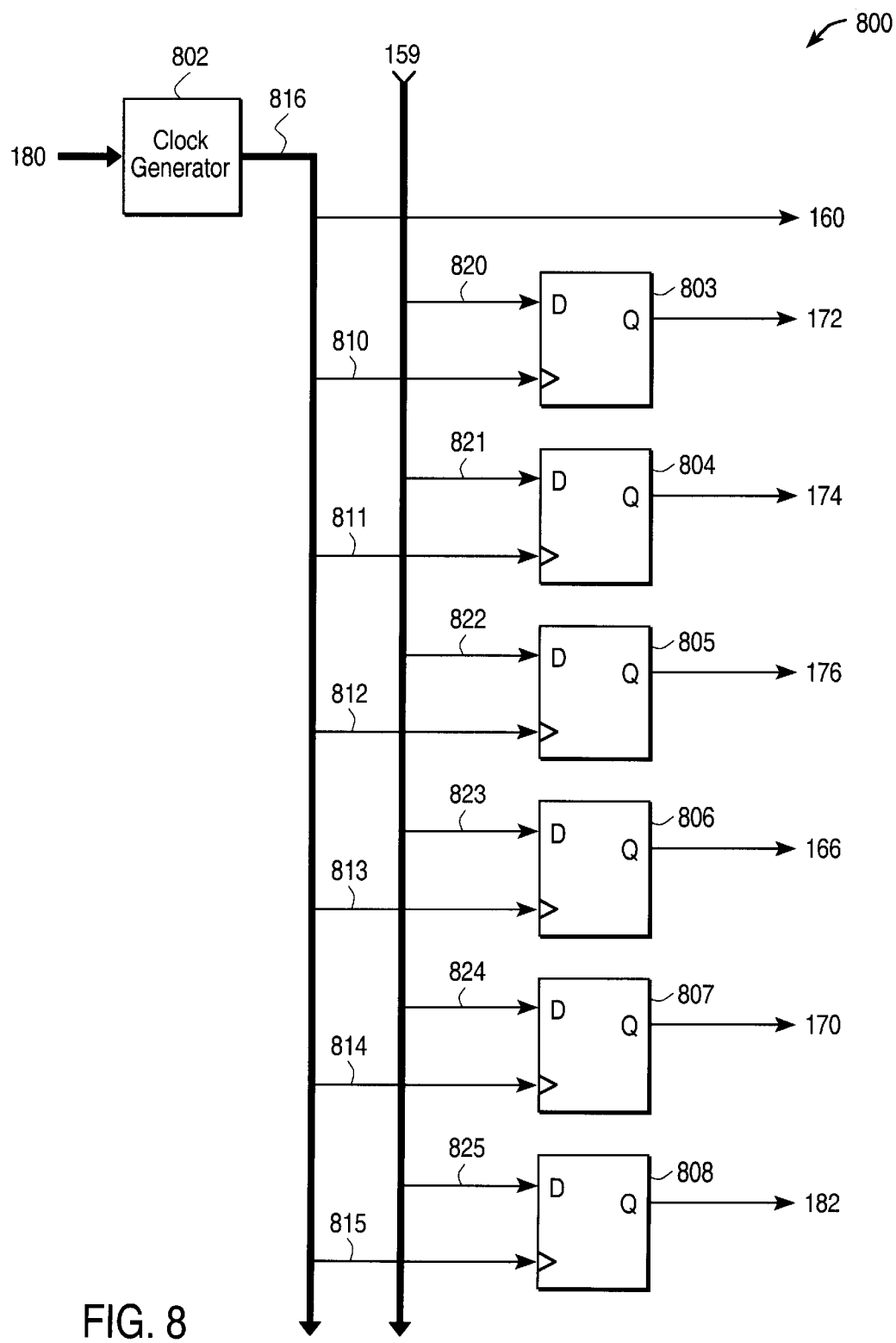
FIG. 8 is another embodiment of the timing generator of FIG. 1.

FIG. 8 illustrates timing generator 800 that is another embodiment of timing generator 126 of FIG. 1. Timing generator 800 includes a clock generator 802 and latches 803–808. Clock buffer 802 generates one or more clock signals on bus 816 in response to one or more buffered clock signals received on bus 180 from clock buffer 124. Alternatively, clock generator 802 may receive CLK 178. The clock signals on bus 816 may be pulse signals or edge transitions, and may be of any pulse width. For one embodiment, the clock signals on bus 816 include pulse signals that are approximately 2 to 6 ns in duration. The clock signals from bus 816 are provided to the clock inputs of latches 803–808. For example, one or more clock signals on lines 810, 811, 812, 813, 814, and 815 are coupled to the clock inputs of latches 803, 804, 805, 806, 807, and 808, respectively. The signals on lines 810–815 may be the same signal or different signals. For one embodiment, the signals on lines 810–815 may be pulse signals that start at the beginning of a clock cycle, the middle of a clock cycle, at the end of a clock cycle, or at any other predetermined time within a clock cycle. Latches 803, 804, 805, 806, 807, and 808 may be self-timed latches that generate pulse signals on lines 172, 174, 176, 166, 170, and 182, respectively, in response to data input signals on lines 820–825 and the assertion of clock signals on lines 810–815. Lines 820–825 may be included in bus 159 output by instruction decoder 128 of FIG. 1.

With respect to FIGS. 6 and 8, clock generator 802 may generate the signal on line 160 at time t0. The signal on line 160 may alternatively be generated by a latch device, but it may be advantageous to generate this signal very close to the rising edge transition of CLK 178. For one embodiment, CLK 178 may be provided on line 160. After the write and compare instruction is decoded, instruction decoder 128 may assert signals on lines 820–825 that cause the pulses on lines 172, 174, 176, 166, 170, and 182 to be generated. Latch 803 may latch the signal on line 820 in response to a clock signal on line 810. The signal on line 810 may arrive at time t1, or latch 803 may receive the signal on line 810 earlier and may delay the generation of the signal on line 172 until time t1. Latch 804 may latch the signal on line 821 in response to a clock signal on line 811. The signal on line 811 may arrive at time t2, or latch 804 may receive the signal on line 811 earlier and may delay the generation of the signal on line 174 until time t2. Latch 805 may latch the signal on line 822 in response to a clock signal on line 812. The signal on line 812 may arrive at time t3, or latch 805 may receive the signal on line 812 earlier and may delay the generation of the signal on line 176 until time t3. Latch 806 may latch the signal on line 823 in response to a clock signal on line 813. The signal on line 813 may arrive at time t4, or latch 806 may receive the signal on line 813 earlier and may delay the generation of the signal on line 166 until time t4. Latch 807 may latch the signal on line 824 in response to a clock signal on line 814. The signal on line 814 may arrive at time t5, or latch 807 may receive the signal on line 814 earlier and may delay the generation of the signal on line 170 until time t5. Latch 808 may latch the signal on line 825 in response to a clock signal on line 815. The signal on line 815 may arrive at time t6, or latch 808 may receive the signal on line 815 earlier and may delay the generation of the signal on line 182 until time t6. There may be one or more latches 808 to output one or more signals on one or more lines 182.

The previous embodiments have described a single clock cycle operation of a write and compare instruction. The CAM device 100 of FIG. 1 may also perform a compare instruction in a single cycle. The compare instruction performs the same steps as the write and compare operation described above excluding the additional step of loading the comparand data into comparand register 120.

Figure 9:
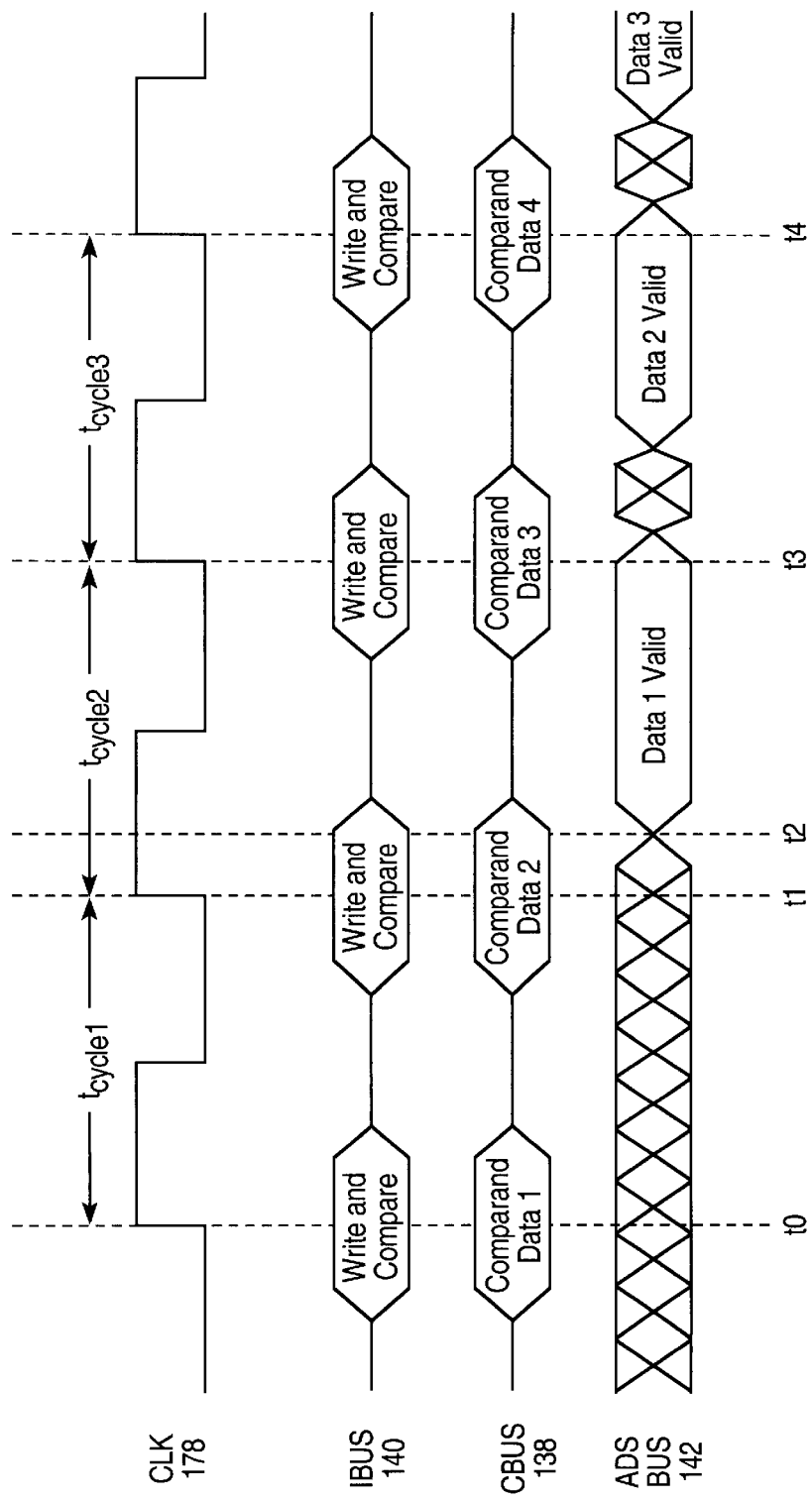
FIG. 9 is a timing diagram illustrating a pipelined mode of operation for the CAM device of FIG. 1.

CAM device 100 may also function in a pipelined mode of operation to take advantage of the fact that CAM device 100 can perform a write and compare instruction (or simply a compare instruction) in a single clock cycle. An example of a pipelined mode of operation is illustrated in FIG. 9. At time t0, a first write and compare instruction is provided to CAM device 100 on bus 140 at the same time that first comparand data is provide on CBUS 138 for comparand register 120. During clock cycle $t_{cycle1}$, all of the steps of the process of FIG. 5 and/or FIG. 6 are performed by CAM device 100. By the end of $t_{cycle1}$, status register 132 receives the match address on bus 146, the match flag signal on line 148, the multiple match flag signal on line 150, the full flag signal on line 156, the device identification information on bus 155, the data read from CAM array 104 on bus 152, and/or validity bits 108 on bus 157. Status register 132 may be updated with this information by one or more signals on bus 182 from timing generator 126 or clock buffer 124.

The rising edge of CLK 178 at time t1 may clock the contents of status register 132 onto ADS BUS 142 via output multiplexer 134 at time t2. Output multiplexer 134 may be configured to output the data from status register 132 rather than bypass the status register 132 by programming one or more bits in configuration register 136. FIG. 10 shows one embodiment of the data output on ADS BUS 142 from status register 132 via output multiplexer 134 when ADS BUS 142 is a 64-bit bus. FIG. 11 shows another embodiment. For alternative embodiments, the data output from status register 132 may be in any other format or order. For yet other embodiments, there may be more than one status register 132 to further pipeline the data to be output to ADS BUS 142.

The time difference between times t1 and t2 may be very fast because it is the time to clock a register element. For one embodiment, the time difference between t1 and t2 may be approximately 2–10 ns. Additionally, the data output to ADS BUS 142 from status register 132 may be valid for a large percentage of the clock cycle time (e.g., approximately 30 percent to approximately 90 percent) as the data will become invalid only at the end of the next clock cycle $t_{cycle2}$.

At the end of clock cycle $t_{cycle}$ and the start of clock cycle $t_{cycle2}$, a second write and compare instruction (or simply a compare instruction) may be provided on IBUS 140 along with second comparand data on CBUS 138. During clock cycle $t_{cycle2}$, all of the steps of the process of FIG. 5 and/or FIG. 6 are performed by CAM device 100. By the end of $t_{cycle2}$, status register 132 receives the match address on bus 146, the match flag signal on line 148, the multiple match flag signal on line 150, the full flag signal on line 156, the device identification information on bus 155, the data read from CAM array 104 via bus 152, and/or validity bits 108 on bus 152. This information will then be available from status register 132 in clock cycle $t_{cycle3}$.

CAM array 104 of CAM device 100 may also operate as a ternary CAM array and perform the "write and compare" or compare operations described above in a single clock cycle or less than three clock cycles. A ternary CAM device is a CAM device that can effectively store three states of information, namely: a logic one state, a logic zero state, and a don't care state for compare operations. This provides more flexibility in the use of CAM device 100.

Figure 12:
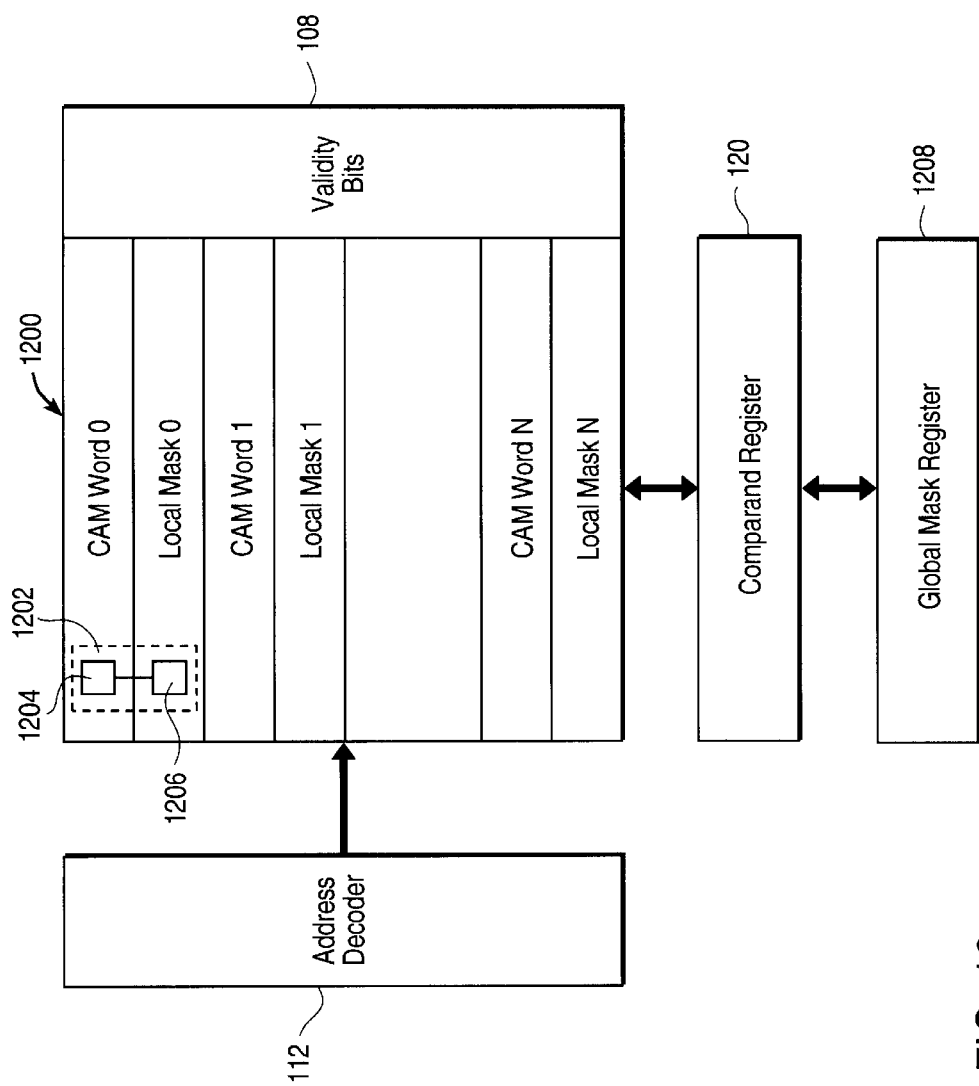
FIG. 12 is a block diagram of one embodiment of a ternary CAM array.

FIG. 12 shows ternary CAM array 1200 that is one embodiment of CAM array 104 of FIG. 1. Each CAM word in ternary CAM array 1200 has an associated local mask word that stores masking data for the CAM word. For example, local mask word zero stores masking data for the CAM cells in CAM word zero, and local mask word N stores masking data for the CAM cells in CAM word N.

In contrast to global mask registers (e.g., global mask register 1208) that mask entire columns of CAM cells, the local mask word is used to mask individual CAM cells of a corresponding CAM word on a bit-by-bit basis. Thus, each CAM cell/local mask cell pair (e.g., CAM cell 1204 and local mask cell 1206) may be considered to be a mask-per-bit CAM cell such as mask-per-bit CAM cell 1202 of FIG. 12.

Local mask information can be written to each of the local mask words directly from comparand bus 138, from comparand register 120, a global mask register (not shown), or from other storage locations in CAM device 100. The local mask locations may be selected for writing by address decoder 112 and the local mask locations may be sequentially or randomly selected to receive local mask data. The local mask data may also be read via sense amplifiers 170 and may be provided to status register 132, output multiplexer 134, ADS BUS 142, comparand register 120, a global mask register, or any other storage element in CAM device 100.

For one embodiment, the local mask cells are volatile mask cells that need to be updated after power up of CAM device 100. The local mask cells may also be updated when the corresponding CAM cells are updated, or at any other time. For another embodiment, the local mask cells may be other types of memory cells including nonvolatile memory cells. Alternatively and/or additionally, the local mask cells may be resettable to a predetermined state, for example, after power-up or by other means.

Figure 13:
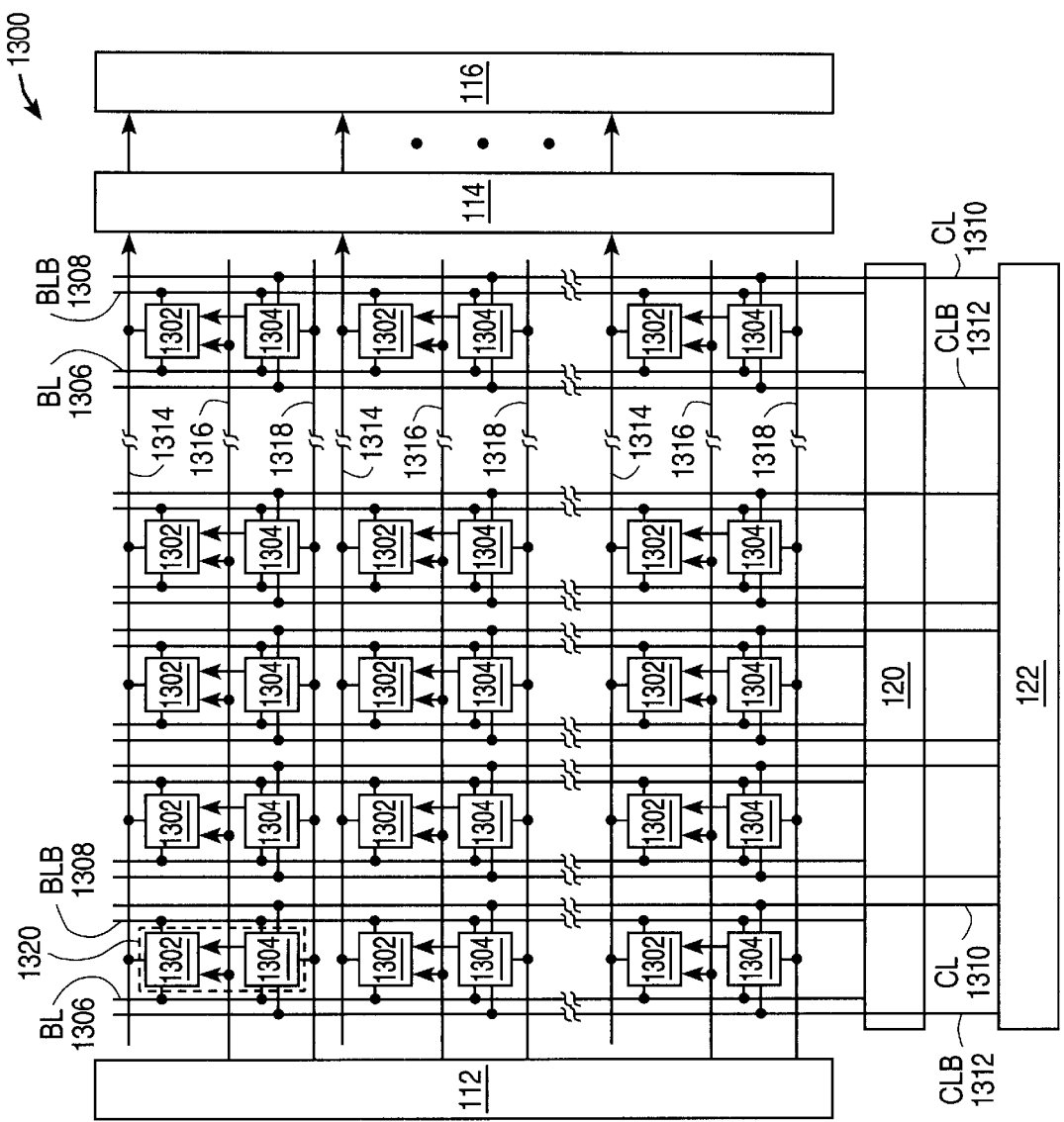
FIG. 13 is one embodiment of the ternary CAM array of FIG. 12.

FIG. 13 shows ternary CAM array 1300 that is one embodiment of ternary CAM array 1200 of FIG. 12. Ternary CAM array 1300 includes CAM words that each include a row of any number of CAM cells 1302, and local mask words that each include a row of any number of mask cells 1304. The validity bits may also be included in additional rows and columns of CAM cells 1302. Each CAM cell 1302 is coupled to match line 1314, word line 1316, bit line BL 1306, and the logical complement of bit line BLB 1308. Each local mask cell 1304 is coupled to a corresponding CAM cell 1302, BL 1306, BLB 1308, comparand line CL 1310, the logical complement of the comparand line CLB 1312, and a mask word line 1318. The comparand lines provide comparand data to the CAM cells 1302 for comparison with the data stored in the CAM data. Although CL 1310 and CLB 1312 are shown as providing data to local mask cells 1304, in alternative embodiments, CAM cells 1302 may additionally or alternatively receive comparand data from CL 1310 and CLB 1312. Additionally, while ternary CAM 1300 shows columns of CAM cells 1302 and mask cells 1304 coupled to common bit lines, in an alternative embodiment, mask cells 1304 may be coupled to separate mask bit lines. Additionally and/or alternatively, word lines 1316 and 1318 may be the same word line.

Each word line 1316 is driven by address decoder 112 to select one or more of CAM cells 1302 for writing or reading. Similarly, each mask word line 1318 is driven by address decoder 112 to select one or more of local mask cells 1304 for writing or reading. Address decoder 112 may drive either the word lines 1316 or the mask word lines 1318 in response to the appropriate instruction decoded by instruction decoder 128 of FIG. 1.

Each CAM cell 1302/local mask cell 1304 pair may be considered a mask-per-bit CAM cell in which the local mask cell 1304 is used to store mask data for its corresponding CAM cell. An exemplary mask-per-bit CAM cell 1320 is shown as including CAM cell 1302 and local mask cell 1304. For alternative embodiments, local mask cell 1304 may be used to store masking data corresponding to more than one CAM cell 1302.

Figure 14:
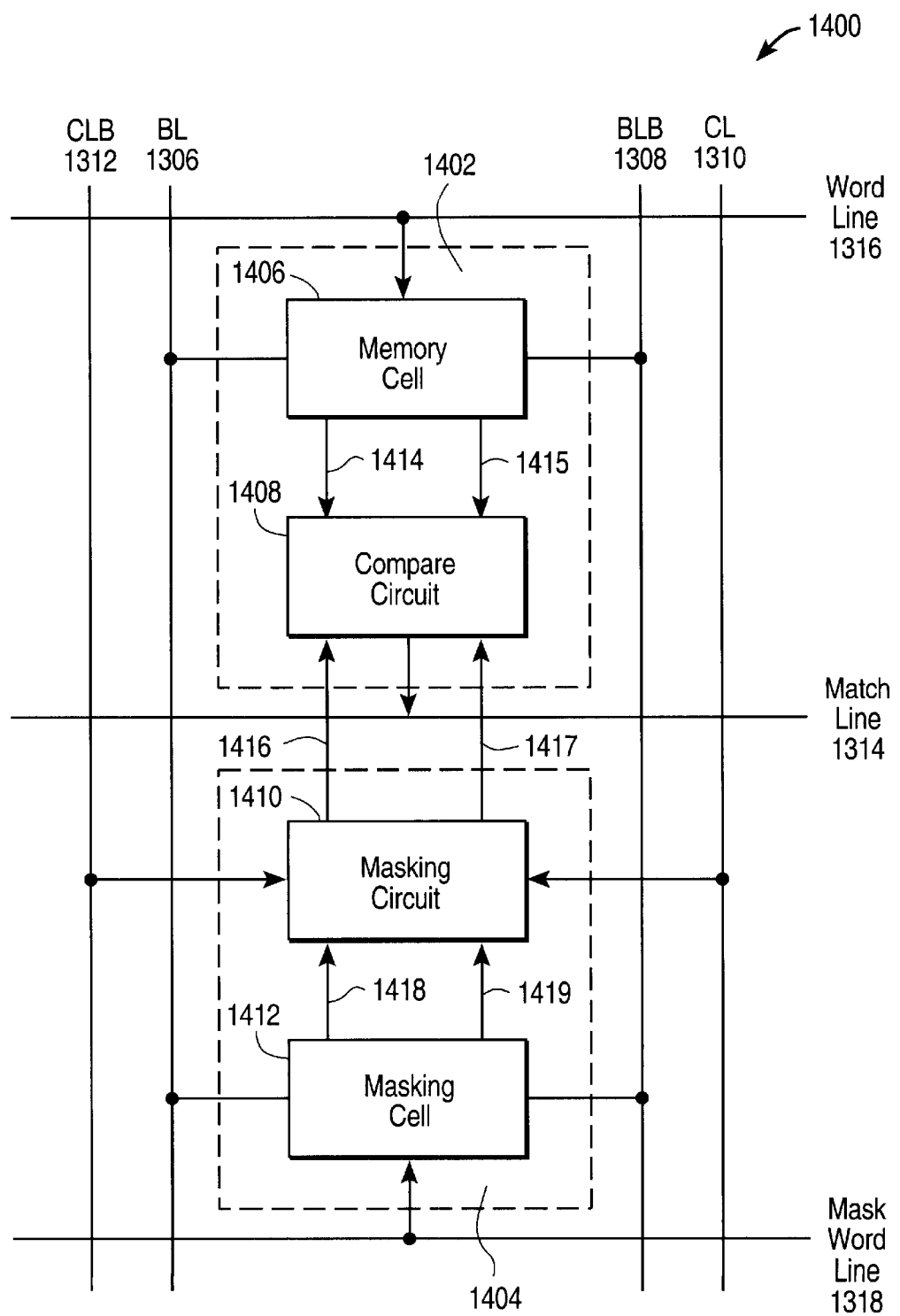
FIG. 14 is a block diagram of one embodiment of a ternary CAM cell.

FIG. 14 shows mask-per-bit ternary CAM cell 1400 that is one embodiment of mask-per-bit ternary CAM cell 1320 of FIG. 13. CAM cell 1400 includes CAM cell 1402 and local mask cell 1404. CAM cell 1402 includes memory cell 1406 and compare circuit 1408. Memory cell 1406 stores data to be compared with comparand data provided on CL 1310 and CLB 1312 during a compare operation. Memory cell 1406 may be any volatile or nonvolatile memory cell. When memory cell 1406 is selected by word line 1316, data may be read from or written to memory cell 1406 via BL 1306 and BLB 1308. Compare circuit 1408 is coupled to memory cell 1406 and compares the data stored in memory cell 1406 with data provided by masking circuit 1410 on lines 1416 and 1417. Compare circuit 1408 outputs the comparison result to match line 1314. Compare circuit 1408 may be any type of comparison circuit including an exclusive OR (XOR) or exclusive NOR (XNOR) gate.

Local mask cell 1404 includes masking cell 1412 and masking circuit 1410. Masking cell 1412 stores masking data that indicates whether the data stored in memory cell 1406 will be masked during a comparison operation. For one embodiment, masking cell 1412 may be any volatile or nonvolatile memory cell. When masking cell 1412 is selected by mask word line 1318, masking data may be read from or written to masking cell 1412 via BL 1306 and BLB 1308. Masking circuit 1410 receives the masking data from masking cell 1412 over lines 1418 and 1419 and in response thereto determines whether the comparand data on CL 1310 and CLB 1312 or masked data is provided to compare circuit 1408 on lines 1416 and 1417. For example, when the masking data stored in masking cell 1412 indicates that the data in memory cell 1406 should be masked from a comparison with the comparand data provided on CL 1310 and CLB 1312, masking circuit 1410 provides masked data to compare circuit 1408 such that compare circuit 1408 indicates a match to match line 1314 regardless of whether the data stored in memory cell 1406 matches the comparand data. The masked data provided on lines 1416 and 1417 may be any predetermined data. For one embodiment, the masked data may be the same or the logical complement of the masking data provided by masking cell 1412 on lines 1418 and 1419.

When the masking data stored in masking cell 1412 indicates that the data stored in memory cell 1406 should not be masked from a comparison with the comparand data, masking circuit 1410 provides the comparand data to compare circuit 1408 to compare with the data stored in memory cell 1406.

Thus, in response to the masking data stored in masking cell 1412, masking circuit 1410 either provides the comparand data or masked data to compare circuit 1408. Conventional mask-per-bit ternary CAM cells generally include a masking element between compare circuitry and the match line and thus mask the comparison result. This tends to slow down the operation of the CAM cell. In contrast, ternary CAM cell 1400 determines the data that is actually compared and may increase the operating speed of CAM cell 1400 in determining the state of match line 1314.

While two signal lines are shown for interfacing between memory cell 1406 and compare circuit 1408 (i.e., lines 1414 and 1415), compare circuit 1408 and masking circuit 1410 (i.e., lines 1416 and 1417), and masking circuit 1410 and masking cell 1412 (i.e., lines 1418 and 1419), any number of signal lines may be used.

Figure 15:
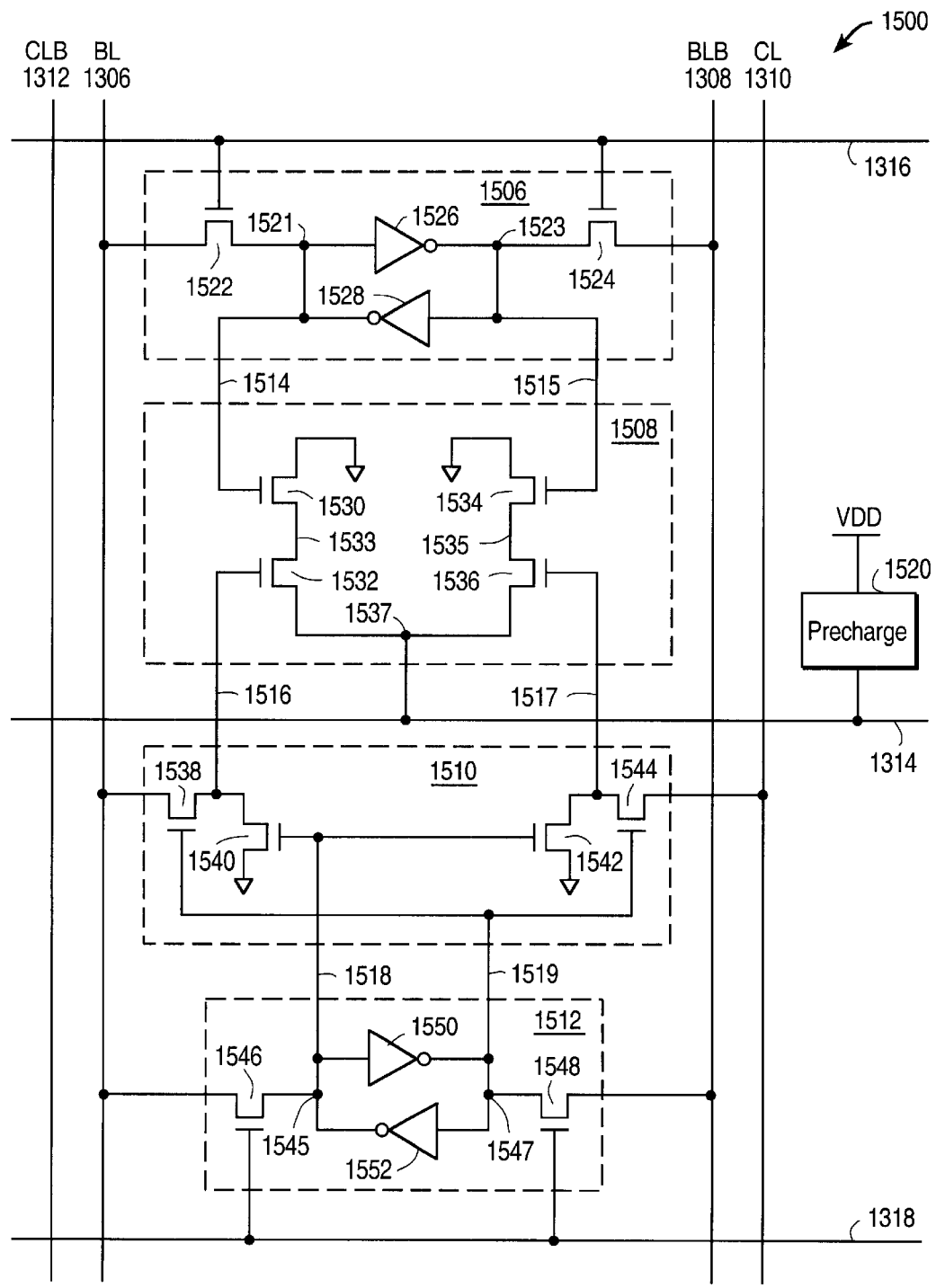
FIG. 15 is a circuit diagram of one embodiment of the ternary CAM cell of FIG. 14.

FIG. 15 shows mask-per-bit ternary CAM cell 1500 that is one embodiment of CAM cell 1400 of FIG. 14. CAM cell 1500 includes memory cell 1506, compare circuit 1508, masking circuit 1510, and masking cell 1512 which are exemplary embodiments of circuits 1406, 1408, 1410, and 1412, respectively. Other embodiments may be used.

Memory circuit 1506 includes two cross-coupled inverters 1526 and 1528 that form a bi-stable latch to store data nodes 1521 and 1523. Data may be communicated between the bi-stable latch and BL 1306 and BLB 1308 via pass gates 1522 and 1524, respectively. Pass gates 1522 and 1524 are controlled by word line 1316. For alternative embodiments, any other type of volatile or nonvolatile memory cell may be used. The data stored by memory cell 1506 is passed on lines 1514 and 1515 to compare circuit 1508 for comparison with the data output by masking circuit 1510.

Masking cell 1512 includes two cross-coupled inverters 1546 and 1548 that form a bi-stable latch to store masking data nodes 1545 and 1547. The masking data is communicated between BL 1306 and BLB 1308 via pass gates 1546 and 1548 that are controlled by mask word line 1318. The masking data stored by the bi-stable latch indicates whether masked data or comparand data is provided to compare circuit 1508 for comparison.

The masking data is provided to masking circuit 1510 on lines 1518 and 1519. Masking circuit 1510 includes transistors 1538 and 1540 that determine whether masked data or comparand data is provided to line 1516 in response to the masking data on lines 1518 and 1519. Transistor 1538 has its source (drain) coupled to CLB 1312, its drain (source) coupled to line 1516, and its gate coupled to line 1519. Transistor 1540 has its drain coupled to line 1516, its source coupled to ground, and its gate coupled to line 1518. Masking circuit 1510 further includes transistors 1542 and 1544 that determine whether masked data or comparand data is provided to line 1517 in response to the masking data on lines 1518 and 1519. Transistor 1544 has its source (drain) coupled to CL 1310, its drain (source) coupled to line 1517, and its gate coupled to line 1519. Transistor 1542 has its drain coupled to line 1517, its source coupled to ground, and its gate coupled to line 1518.

Compare circuit 1508 includes two sets of transistors to compare the data output by memory cell 1506 on signal lines 1514 and 1515 with the data output by masking circuit 1510 on lines 1516 and 1517. The first set of transistors includes transistors 1530 and 1532. Transistor 1530 has its source coupled to ground, its drain coupled to the drain (source) of transistor 1532, and its gate coupled to signal line 1514. Transistor 1532 has its source (drain) coupled to match line 1314 and its gate coupled to signal line 1516. The second set of transistors includes transistors 1534 and 1536. Transistor 1534 has its source coupled to ground, its drain coupled to the drain (source) of transistor 1536, and its gate coupled to signal line 1515. Transistor 1536 has its gate coupled to signal line 1517 and its source (drain) coupled to match line 1314. Match line 1314 may be precharged to a voltage approximately equal to a power supply voltage VDD by precharge circuit 1520.

The operation of CAM cell 1500 may be illustrated as follows. When masking is disabled, masking cell 1512 provides a logic zero signal on line 1518 to turn off transistors 1540 and 1542, and further provides a logic one signal on line 1519 to enable transistors 1538 and 1544 to provide comparand data from CLB 1312 and CL 1310 to lines 1516 and 1517, respectively. Thus, when masking is disabled, compare circuit 1508 may compare the data on lines 1514 and 1515 with the comparand data from CLB 1312 and CL 1310, respectively. If there is a match, neither set of transistors in compare circuit 1508 will provide a path to ground and the state of match line 1314 will remain unaltered. If there is no match, match line 1314 will be discharged towards ground through at least one of the sets of transistors in compare circuit 1508.

When masking is enabled, masking cell 1512 provides a logic zero signal on line 1519 to turn off transistors 1538 and 1544 such that the comparand data is not provided to signal lines 1516 and 1517. Additionally, masking cell 1512 provides a logic one signal on signal line 1518 to turn on transistors 1540 and 1542 and pull lines 1516 and 1517 towards a ground potential. When signal lines 1516 and 1517 are pulled towards a ground potential, transistors 1532 and 1536 are turned off such that no path to ground is available in compare circuit 1508 regardless of whether the comparand data on CLB 1312 and CL 1310 matches the data stored by memory cell 1506. Thus, CAM cell 1500 effectively stores a don't care state for the compare operation.

Figure 16:
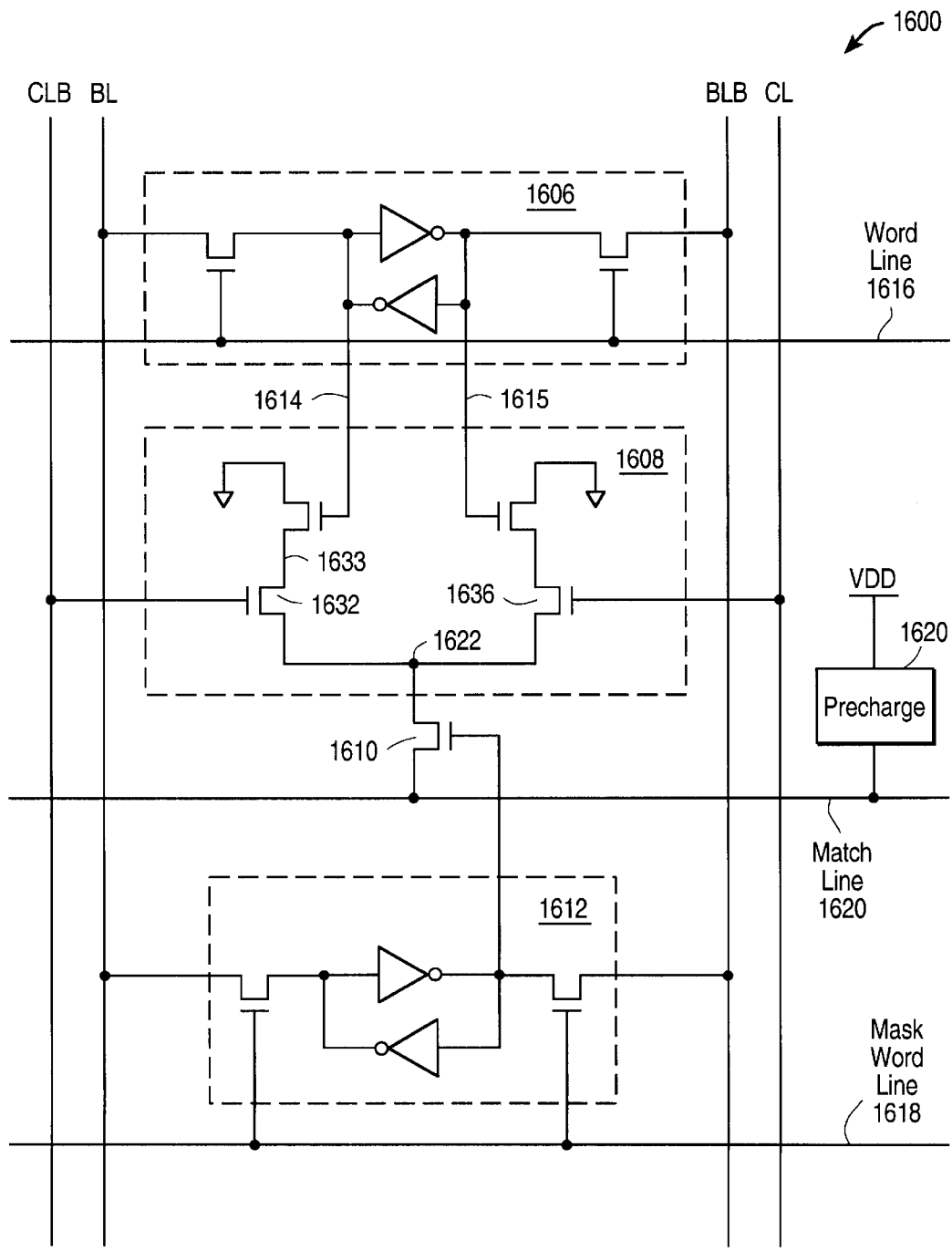
FIG. 16 is a circuit diagram of another ternary CAM cell.

CAM cell 1500 may provide a speed advantage in resolving the state of match line 1314 over other ternary CAM architectures. One example of another ternary CAM 1600 is shown in FIG. 16 which includes a memory circuit 1606, compare circuit 1608, mask cell 1612, and masking transistor 1610. Compare circuit 1608 compares the data stored in memory cell 1606 with the comparand data on CLB and CL and provides the compare result to node 1622. Mask cell 1612 stores masking data that controls masking transistor 1610. Masking transistor 1610 determines whether the comparison result at node 1622 is provided to match line 1620. Consider the case where masking is disabled (transistor 1610 on), and data provided on line 1615 is a logic zero. During a compare operation, if CLB provides a logic one to transistor 1632 (a matching condition) nodes 1622 and 1633 will each charge to VDD minus a threshold voltage (VT) of NMOS transistors 1610 and 1632, respectively. During a subsequent mismatching cycle, nodes 1633 and 1622 will need to be discharged along with match line 1614. Thus, ternary CAM cells that place the masking circuit in between the compare circuit and the match line to gate the match result can result in undesirable charged nodes that must be discharged when a mismatch is determined.

In contrast to CAM cell 1600, CAM cell 1500 uses masking circuit 1510 to determine the data supplied to compare circuit 1508. Masking circuit 1510 is not used to gate a completed comparison to match line 1314. Thus, match line 1314 may be charged and discharged faster than other ternary CAM cell architectures. For example, consider the case where match line 1314 is initially precharged to a high logic state and one or more ternary CAM cells such as CAM cell 1500 indicate a non-masked matching condition. During a comparison operation, the non-masked matching cells will each have an intermediate node 1533 or 1535 that will charge to approximately VDD-2VT, while node 1537 remains precharged to approximately VDD by precharge circuit 1520. If one of the ternary CAM cells coupled to the same match line subsequently indicates a non-masked mismatching condition in a subsequent compare operation, then the non-masked mismatching cell will need to discharge match line 1314 and the intermediate nodes 1533 (and/or 1535) of the non-masked matching cells. Note that only one intermediate node 1533 or 1535 will have to be discharged rather than two intermediate nodes as illustrated in ternary CAM cell 1600 of FIG. 16. Similarly, if the non-masked mismatching cell subsequently indicates a non-masked matching condition in a subsequent compare operation, then only one intermediate node 1533 or 1535 will need to be charged to VDD-2VT by the precharge circuit 1620. This can result in a significant decrease in the time required to resolve the state of match line 1314 and thus may result in a significant decrease in the time required to generate a match flag for the CAM device.

Figure 17:
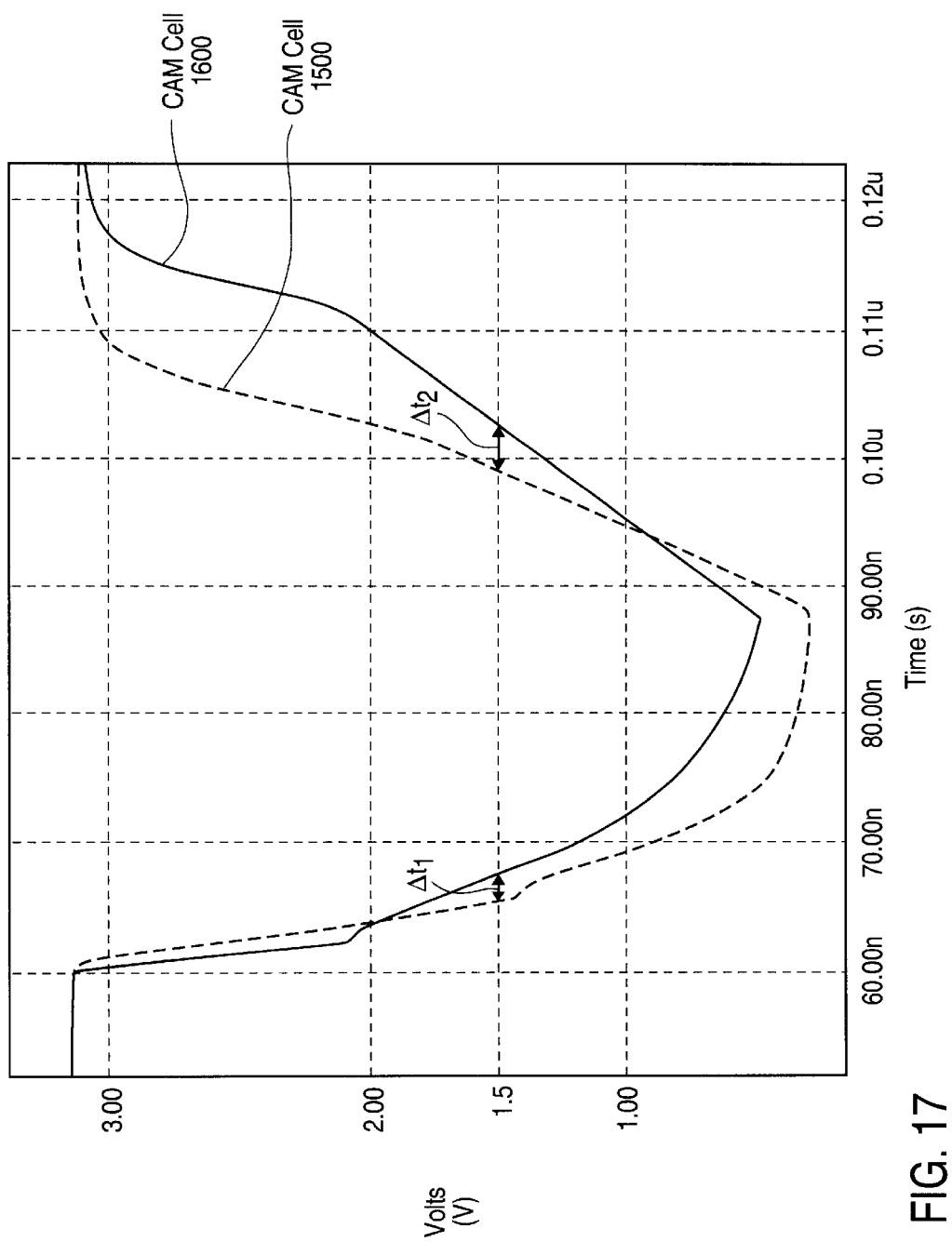
FIG. 17 is a graph comparing the performance of the ternary CAM cells of FIGS. 15 and 16.

The graph in FIG. 17 shows exemplary simulation data taken for one embodiment of CAM cells 1500 and 1600 at a VDD of approximately 3.14 volts. As the graph illustrates, the speed increase ($\Delta t1$) in discharging a match line for a non-masked non-matching condition is approximately 2.3 nanoseconds (ns) at 1.5 volts for CAM cell 1500 over CAM cell 1600. The graph further illustrates that the speed increase ($\Delta t2$) in charging a match lines for a non-masked matching condition is approximately 3.8 nanoseconds (ns) at 1.5 volts for CAM cell 1500 over CAM cell 1600.

The response time of CAM cell 1500 may be further increased by placing PMOS transistors across transistors 1538 and 1544. For example, a PMOS transistor may have source (drain) coupled to the source (drain) of transistor 1538 and CLB 1312, its drain (source) coupled to the drain (source) of transistor 1538 and signal line 1516, and its gate coupled to signal line 1518. A similarly configured PMOS transistor may be coupled across transistor 1544. This configuration may provide a higher gate voltage of approximately VDD to signal lines 1516 and 1517 such that node 1533 or 1535 is approximately VDD-VT when a non-masked matching conditions occurs. This may further increase the response time of the CAM cell 1500 by approximately 0.5 to 3 ns.

Figure 18:
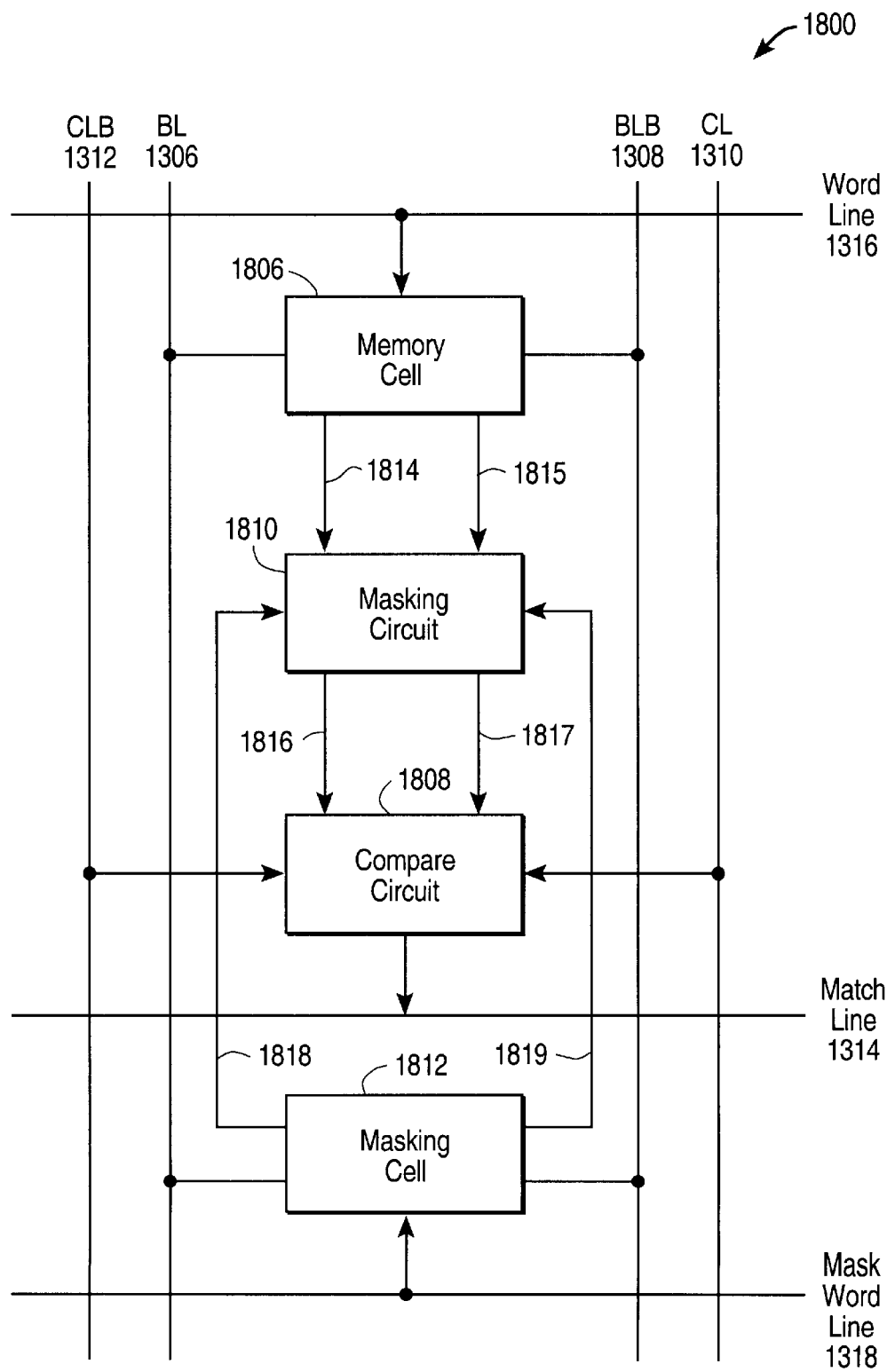
FIG. 18 is a block diagram of another ternary CAM cell.

FIG. 18 shows mask-per-bit ternary CAM cell 1800 that is another embodiment of mask-per-bit ternary CAM cell 1320 of FIG. 13. CAM cell 1800 includes a CAM cell and a local mask cell. The CAM cell includes memory cell 1806 and compare circuit 1808. The local mask cell includes masking circuit 1810 and mask cell 1812. Memory cell 1806 stores data to be compared with comparand data provided on CL 1310 and CLB 1312 during a compare operation. Memory cell 1806 may be any volatile or nonvolatile memory cell. When memory cell 1806 is selected by word line 1316, data may be read from or written to memory cell 1806 via BL 1306 and BLB 1308.

Masking cell 1812 stores masking data that indicates whether the data stored in memory cell 1806 will be masked during a comparison operation. Masking cell 1812 may be any volatile or nonvolatile memory cell. When masking cell 1812 is selected by mask word line 1318, masking data may be read from or written to masking cell 1812 via BL 1306 and BLB 1308. Masking circuit 1810 receives the masking data from masking cell 1812 over lines 1818 and 1819 and in response thereto determines whether the data stored in memory cell 1806 (provided on lines 1814 and 1815) or masked data is provided to compare circuit 1808 on lines 1816 and 1817.

Compare circuit 1808 compares comparand data on lines CLB 1312 and CL 1310 with data provided by masking circuit 1810 on lines 1816 and 1817. Compare circuit 1808 outputs the comparison result to match line 1314. Compare circuit 1808 may be any type of comparison circuit including an exclusive OR (XOR) or exclusive NOR (XNOR) gate.

When the masking data stored in masking cell 1812 indicates that the data in memory cell 1806 should be masked from a comparison with the comparand data provided on CL 1310 and CLB 1312, masking circuit 1810 provides masked data on lines 1816 and 1817 to compare circuit 1808 such that compare circuit 1808 indicates a match to match line 1314 regardless of whether the data stored in memory cell 1806 matches the comparand data. The masked data provided on lines 1816 and 1817 may be any predetermined data. For one embodiment, the masked data may be the same or the logical complement of the masking data provided on lines 1818 and 1819.

When the masking data stored in masking cell 1812 indicates that the data in memory cell 1806 should not be masked from a comparison with the comparand data, masking circuit 1810 provides the data stored in memory cell 1806 to compare circuit 1808 to compare with the comparand data on CLB 1312 and CL 1310.

Thus, in response to the masking data stored in masking cell 1812, masking circuit 1810 either provides the data stored in memory cell 1806 or masked data to compare circuit 1808. This configuration is also faster in resolving the state of match line 1314 than typical ternary CAM cells such as CAM cell 1600 of FIG. 16.

While two signal lines are shown for interfacing between memory cell 1806 and masking circuit 1810 (i.e., lines 1814 and 1815), compare circuit 1808 and masking circuit 1810 (i.e., lines 1816 and 1817), and masking circuit 1810 and masking cell 1812 (i.e., lines 1818 and 1819), any number of signal lines may be used.

Figure 19:
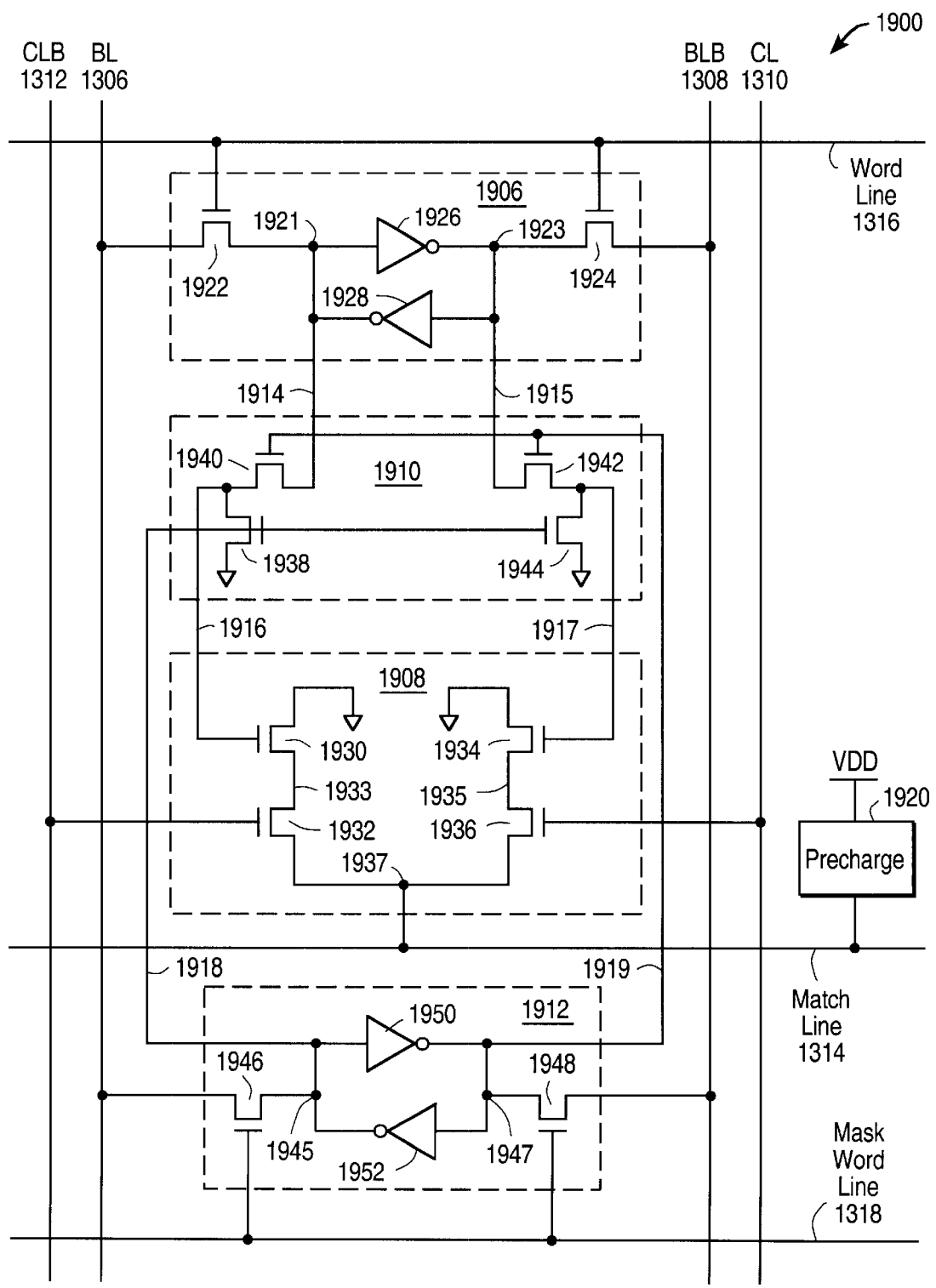
FIG. 19 is a circuit diagram of one embodiment of the ternary CAM cell of FIG. 18.

FIG. 19 shows mask-per-bit ternary CAM cell 1900 that is one embodiment of CAM cell 1800 of FIG. 18. CAM cell 1900 includes memory cell 1906, compare circuit 1908, masking circuit 1910, and masking cell 1912 which are exemplary embodiments of circuits 1806, 1808, 1810, and 1812, respectively. Other embodiments may be used.

Memory circuit 1906 includes two cross-coupled inverters 1926 and 1928 that form a bi-stable latch to store data on nodes 1921 and 1923. Data may be communicated between the bi-stable latch and BL 1306 and BLB 1308 via pass gates 1922 and 1924, respectively. Pass gates 1922 and 1924 are controlled by word line 1316. For alternative embodiments, any other type of volatile or nonvolatile memory cell may be used. The data stored by memory cell 1906 is passed on lines 1914 and 1916 to compare circuit 1908 for comparison with the data output by masking circuit 1910.

Masking cell 1912 includes two cross-coupled inverters 1950 and 1952 that form a bi-stable latch to store data on nodes 1945 and 1947. The masking data is communicated between BL 1306 and BLB 1308 via pass gates 1946 and 1948 that are controlled by mask word lines 1318. The masking data stored by the bi-stable latch indicates whether masked data or data stored in memory cell 1906 is provided to compare circuit 1908 for comparison with comparand data.

The masking data is provided to masking circuit 1910 on lines 1918 and 1919. Masking circuit 1910 includes transistors 1938 and 1940 that determine whether masked data or data on line 1914 is provided to line 1916 in response to the masking data on lines 1918 and 1919. Transistor 1938 has its source coupled to ground, its drain coupled to line 1916, and its gate coupled to line 1918. Transistor 1940 has its drain (source) coupled to line 1916, its source (drain) coupled to line 1914, and its gate coupled to line 1919. Masking circuit 1910 further includes transistors 1942 and 1944 that determine whether masked data or data on line 1915 is provided to line 1917 in response to the masking data on lines 1918 and 1919. Transistor 1944 has its source coupled to ground, its drain coupled to line 1917, and its gate coupled to line 1918. Transistor 1942 has its drain (source) coupled to line 1917, its source (drain) coupled to line 1915, and its gate coupled to line 1919.

Compare circuit 1908 includes two sets of transistors to compare the data output by memory cell 1906 on signal lines 1914 and 1915 with the comparand data on CLB 312 and CL 310. The first set of transistors includes transistors 1930 and 1932. Transistor 1930 has its source coupled to ground, its drain coupled to the drain (source) of transistor 1932, and its gate coupled to signal line 1916. Transistor 1932 has its source (drain) coupled to match line 1314 and its gate coupled to CLB 1312. The second set of transistors includes transistors 1934 and 1936. Transistor 1934 has its source coupled to ground, its drain coupled to the drain (source) of transistor 1936, and its gate coupled to signal line 1917. Transistor 1936 has its gate coupled to CL 1310 and its source (drain) coupled to match line 1314. Match line 1314 may be precharged to a voltage approximately equal to a power supply voltage VDD by precharge circuit 1920.

The operation of CAM cell 1900 may be illustrated as follows. When masking is disabled, masking cell 1912 provides a logic zero signal on line 1918 to turn off transistors 1938 and 1944, and further provides a logic one signal on line 1919 to enable transistors 1940 and 1942 to provide the data on lines 1914 and 1915 to lines 1916 and 1917, respectively. Thus, when masking is disabled, compare circuit 1908 compares the data on lines 1914 and 1915 with the comparand data from CLB 1312 and CL 1310, respectively. If there is a match, neither set of transistors in compare circuit 1908 will provide a path to ground and the state of match line 1314 will remain unaltered. If there is no match, then match line 1314 will be discharged towards ground through at least one of the sets of transistors in compare circuit 1908.

When masking is enabled, masking cell 1912 provides a logic zero signal on line 1919 to turn off transistors 1940 and 1942 such that the memory cell data is not provided to signal lines 1916 and 1917. Additionally, masking cell 1912 provides a logic one signal on signal line 1918 to turn on transistors 1938 and 1944 and pull lines 1916 and 1917 towards a ground potential. When signal lines 1916 and 1917 are pulled towards a ground potential, transistors 1930 and 1934 are turned off such that no path to ground is available in compare circuit 1908 regardless of whether the comparand data on CLB 1312 and CL 1310 matches the data stored by memory cell 1906. Thus, the comparison operation is masked.

As with ternary CAM cell 1500, masking circuit 1910 is not used to gate a completed comparison to match line 1314; rather, CAM cell 1900 uses masking circuit 1910 to determine the data supplied to compare circuit 1908. Thus, match line 1314 may be charged and discharged faster than other ternary CAM cell architectures. For example, consider the case where match line 1314 is initially precharged to a high logic state and one or more ternary CAM cells such as CAM cell 1900 indicate a non-masked matching condition. During a comparison operation, the non-masked matching cells will each have an intermediate node 1933 or 1935 that will charge to approximately VDD-VT, while node 1937 remains precharged to approximately VDD by precharge circuit 1920. If one of the ternary CAM cells coupled to the same match line subsequently indicates a non-masked mismatching condition in a subsequent compare operation, then the non-masked mismatching cell will need to discharge match line 1314 and the intermediate nodes 1933 (and/or 1935) of the non-masked matching cells. Note that only one intermediate node 1933 or 1935 will have to be discharged rather than two intermediate nodes as illustrated in ternary CAM cell 1600 of FIG. 16. Similarly, if the non-masked mismatching cell subsequently indicates a non-masked matching condition in a subsequent compare operation, then only one intermediate node 1933 or 1935 will need to be charged to VDD-VT by the precharge circuit 1920 and the other non-masked matching cells. This can result in a significant decrease in the time required to resolve the state of match line 1314 and thus may result in a significant decrease in the time required to generate a match flag for the CAM device.

The response time of CAM cell 1900 may be further increased by placing PMOS transistors across transistors 1940 and 1942. For example, a PMOS transistor may have source (drain) coupled to the source (drain) of transistor 1940 and line 1914, its drain (source) coupled to the drain (source) of transistor 1940 and signal line 1916, and its gate coupled to signal line 1918. A similarly configured PMOS transistor may be coupled across transistor 1942. This configuration may provide a higher gate voltage of approximately VDD to signal lines 1916 and 1917 such that node 1933 or 1935 is approximately VDD-VT when a non-masked matching conditions occurs. This may further increase the response time of the CAM cell 1500.

Figure 20:
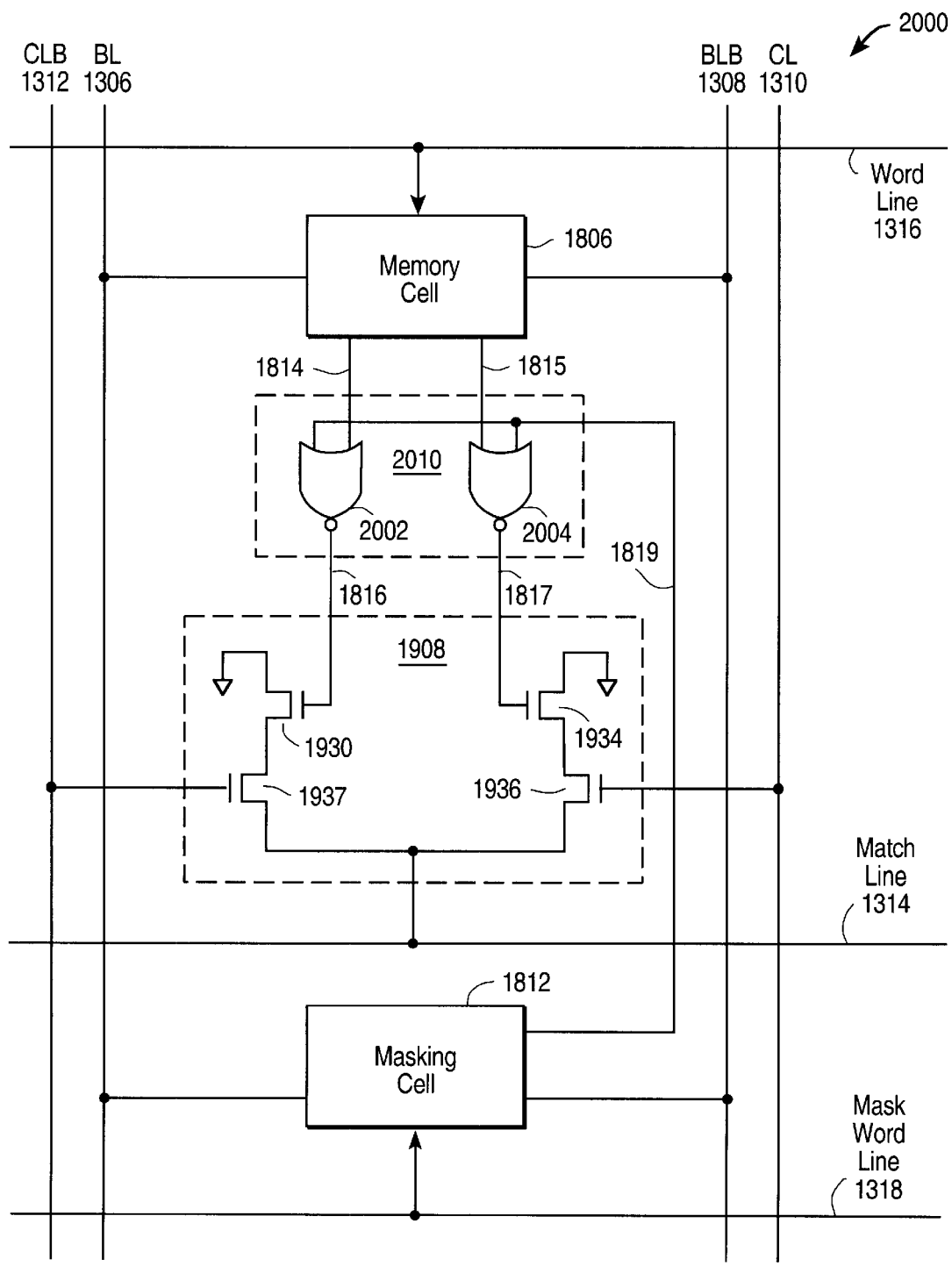
FIG. 20 is another embodiment of a ternary CAM cell.

FIG. 20 shows ternary CAM cell 2000 that is another embodiment of CAM cell 1800 of FIG. 18. CAM cell 2000 includes a compare circuit 1908 that is the same as for CAM cell 1900 of FIG. 19, but includes a different masking circuit 2010. Masking circuit 2010 includes two NOR gates 2002 and 2004 that provide either masked data or the data stored in memory cell 1806 to lines 1816 and 1817 in response to masking data stored in masking cell 1812 and provided on line 1819. NOR gate 2002 has a first input coupled to signal line 1814, a second input coupled to the masking data on line 1819, and an output coupled to the gate of transistor 1930 via signal line 1816. NOR gate 2004 has a first input coupled to signal line 1815, a second input coupled to the masking data on line 1819, and an output coupled to the gate of transistor 1934 via signal line 1817. When the masking data is a logic zero on signal line 1819, masking is disabled and the logical complement of the data stored in memory cell 1806 is provided to compare circuit 1908 for comparison with the comparand data on CLB 1312 and CL 1310. When the masking data is a logic one on signal line 1819, masking is enable and masked data is provided to compare circuit 1908 such that match line 1314 cannot be discharged. For other embodiments, one or more other logic gates may be used in place of NOR gates 2002 and 2004, and one or more signals may be generated by masking cell 1812.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A content addressable memory (CAM) cell for coupling to a match line, the CAM cell comprising:
   a first memory cell for storing first data;
   a second memory cell for storing masking data;
   a masking circuit to receive comparand data and said masking data, and to output second data; and
   a compare circuit coupled to said memory cell and said masking circuit, said compare circuit to compare said first data and said second data to affect a logical state of said match line.

2. The CAM circuit of claim 1, wherein said second data comprises said comparand data.

3. The CAM circuit of claim 1, wherein said second data comprises masked data generated in response to said masking data.

4. The CAM circuit of claim 1, further comprising:
   a word line coupled to said first memory cell;
   a first bit line coupled to said first memory cell;
   a second bit line coupled to said first memory cell;
   a first comparand line coupled to said masking circuit; and
   a second comparand line coupled to said masking circuit.

5. The CAM circuit of claim 4, further comprising:
   a mask word line coupled to said second memory cell;
   a first mask bit line coupled to said second memory cell; and
   a second mask bit line coupled to said second memory cell.

6. The CAM circuit of claim 1, wherein said masking circuit comprises:
   a first transistor having a source coupled to ground, a drain coupled to an input of said compare circuit, and a gate coupled to said second memory cell to receive said masking data; and
   a second transistor having a source coupled to the drain of said first transistor, a drain coupled to receive said comparand data from a comparand signal line, and a gate coupled to said second memory cell to receive said masking data.

7. The CAM circuit of claim 6, wherein said gate of said first transistor is coupled to a first node of said second memory cell to receive said masking data, and said gate of said second transistor is coupled to a second node of said second memory cell to receive a version of said masking data that is a logical complement of said masking data at said first node.

8. A content addressable memory (CAM) circuit for coupling to a match line, the CAM circuit comprising:
   a first memory cell for storing memory data;
   a second memory cell for storing masking data
   a masking circuit having inputs to receive said memory data and said masking data, and further having an output to provide first data; and
   a compare circuit coupled to said masking circuit, said compare circuit to compare said first data and comparand data to affect a logical state of said match line.

9. The CAM circuit of claim 8, wherein said first data comprises said memory data.

10. The CAM circuit of claim 8, wherein said first data comprises mask data generated in response to said masking data.

11. The CAM circuit of claim 8, further comprising:
    a word line coupled to said first memory cell;
    a first bit line coupled to said first memory cell;

a second bit line coupled to said first memory cell;

a first comparand line coupled to said compare circuit; and a second comparand line coupled to said compare circuit.

12. The CAM circuit of claim 11, further comprising:

a mask word line coupled to said second memory cell;

a first mask bit line coupled to said second memory cell; and a second mask bit line coupled to said second memory cell.

13. The CAM circuit of claim 8, wherein said masking circuit comprises a first transistor having a source coupled to ground, a drain coupled to an input of said compare circuit, and a gate coupled to said second memory cell; and a second transistor having a source coupled to said first memory cell, a drain coupled to the drain of said first transistor, and a gate coupled to said second memory cell.

14. The CAM circuit of claim 8, wherein said masking circuit comprises a NOR gate.

15. A method of operating a content addressable memory (CAM) device, said method comprising:

providing first data from a memory cell to a compare circuit;

providing second data from a masking circuit to said compare circuit;

comparing said first data and said second data; and determining a logical state of a match line in response to said comparison.

16. The method of claim 15 wherein said second data comprises comparand data.

17. The method of claim 15 wherein said second data comprises masked data.

18. A method of operating a content addressable (CAM) device, said method comprising:

providing first data from a masking circuit to a compare circuit;

providing comparand data to said compare circuit;

comparing said first data with said comparand data; and determining a logical state of a match line in response to said comparison.

19. The method of claim 18 wherein said first data comprises data stored in a memory cell.

20. The method of claim 18 wherein said first data comprises masked data.

21. A method of accessing data from a synchronous content addressable memory (CAM) device, comprising:

loading data into a plurality of CAM cells in the CAM device;

loading individual mask data for each of the plurality of CAM cells into a plurality of mask cells in the CAM device;

instructing the CAM device to compare comparand data with data stored in the plurality of CAM cells;

comparing the comparand data with the data stored in each of the plurality of CAM cells that is not masked by the individual mask data;

reading the data stored in at least one of the plurality of CAM cells concurrently with comparing the comparand data with the data stored in each of the plurality of CAM cells; and outputting the sensed data from the CAM device.

22. A synchronous content addressable memory (CAM) device comprising:

a CAM array having:

a plurality of individually maskable CAM cells each including a memory cell to store data and a mask cell to store masking data, a plurality of match lines coupled to the CAM cells, a plurality of bit lines coupled to the CAM cells to provide data for storage in the CAM cells in a write operation, and to receive data output from the memory cells in a read operation, and a plurality of comparand lines coupled to the CAM cells to provide comparand data in a compare operation;

a clock input for receiving a clock signal;

an encoder coupled to the CAM array for encoding signals on the match lines and generating an encoded match address;

an address decoder coupled to the CAM array; and an instruction decoder coupled to the CAM array and the clock input, the instruction decoder to receive an instruction that instructs the CAM device to compare comparand data present on the plurality of comparand lines with the data stored in the memory cells of the individually maskable CAM cells and output the encoded match address.

23. The synchronous CAM device of claim 22, further comprising a timing generator coupled to the instruction decoder and the clock input, the timing generator for outputting a plurality of signals to the comparand storage element, the encoder and the address decoder.

24. The synchronous CAM device of claim 22, wherein the encoder comprises a priority encoder.

25. The synchronous CAM device of claim 22, wherein the individually maskable CAM cells each further comprise:

a masking circuit coupled to receive a comparand signal from a first signal line and the masking data from the mask cell, the masking circuit being adapted to output, according to the masking data, either the comparand signal or a fixed-level signal; and a compare circuit coupled to receive the signal output by the masking circuit and the data from the memory cell, the compare circuit being adapted to affect a logical state of a match line if the data and the signal output by the masking circuit are in a predetermined logical relationship.

26. The synchronous CAM device of claim 22, wherein the individually maskable CAM cells each further comprise:

a masking circuit coupled to receive the data from the memory cell and the masking data from the mask cell, the masking circuit being adapted to output, according to the masking data, either the data from the memory cell or a fixed-level signal; and a compare circuit coupled to receive the signal output by the masking circuit and a comparand signal from a first signal line, the compare circuit being adapted to affect a logical state of a match line if the comparand signal and the signal output by the masking circuit are in a predetermined logical relationship.

27. The synchronous CAM device of claim 22, wherein the memory cell of at least one of the individually maskable CAM cells is switchably coupled to a first signal line to receive the data therefrom, and the at least one individually maskable CAM cell further comprises:

a compare circuit coupled to receive the data from the memory cell and coupled to a second signal line to receive a comparand signal therefrom, the second signal line being distinct from the first signal line, the compare circuit being adapted to compare the comparand signal and the data from the first memory cell and to affect a logical state of a match line if the comparand signal and the data are in a predetermined logical relationship; and a mask circuit, coupled to the compare circuit and the match line, to prevent the compare circuit from affecting the logical state of the match line if the masking data is a first logical value.

28. A content addressable memory (CAM) cell comprising:

a memory cell to store a data value;

a mask cell to store a mask value;

a masking circuit coupled to receive a comparand signal from a first signal line and the mask value from the mask cell, the masking circuit being adapted to output, according to the mask value, either the comparand signal or a fixed-level signal; and a compare circuit coupled to receive the signal output by the masking circuit and the data value from the memory cell, the compare circuit being adapted to affect a logical state of a match line if the data value and the signal output by the masking circuit are in a predetermined logical relationship.

29. The CAM cell of claim 28 wherein the data value and the signal output by the masking circuit are in the predetermined logical relationship if the data value and the signal output by the masking circuit are both at a first logical level.

30. The CAM cell of claim 29 wherein the fixed-level signal is at a second logical level, the second logical level being distinct from the first logical level.

31. The CAM cell of claim 28 wherein the compare circuit is prevented from affecting the logical state of the match line if the fixed-level signal is output by the masking circuit.

32. The CAM cell of claim 31 wherein the masking circuit is adapted to output the fixed-level signal if the mask value is in a first logical state and to output the comparand signal if the mask value is in a second logical state.

33. The CAM cell of claim 28 wherein the memory cell is switchably coupled to a second signal line to receive the data value therefrom in a data write operation, the second signal line being distinct from the first signal line.

34. The CAM cell of claim 33 wherein the mask cell is switchably coupled to the second signal line to receive the data value therefrom in a mask write operation.

35. The CAM cell of claim 28 wherein the memory cell is switchably coupled to a second signal line, the memory cell being responsive to a control signal to output the data value onto the second signal line.

36. The CAM cell of claim 35 wherein the data value is output onto the second signal line concurrently with the comparand signal being received from the first signal line by the masking circuit.

37. A content addressable memory (CAM) cell comprising:

a memory cell to store a data value;

a mask cell to store a mask value;

a masking circuit coupled to receive the data value from the memory cell and the mask value from the mask cell, the masking circuit being adapted to output, according to the mask value, either the data value or a fixed-level signal; and a compare circuit coupled to receive the signal output by the masking circuit and a comparand signal from a first signal line, the compare circuit being adapted to affect a logical state of a match line if the comparand signal and the signal output by the masking circuit are in a predetermined logical relationship.

38. The CAM cell of claim 37 wherein the comparand signal and the signal output by the masking circuit are in the predetermined logical relationship if the comparand signal and the signal output by the masking circuit are both at a first logical level.

39. The CAM cell of claim 37 wherein the compare circuit is prevented from affecting the logical state of the match line if the fixed-level signal is output by the masking circuit.

40. The CAM cell of claim 39 wherein the masking circuit is adapted to output the fixed-level signal if the mask value is in a first logical state and to output the data value if the mask value is in a second logical state.

41. A content addressable memory (CAM) cell comprising:

a memory cell to store a data value, the memory cell being switchably coupled to a first signal line to receive the data value therefrom;

a mask cell to store a mask value;

a compare circuit coupled to receive the data value from the memory cell and coupled to a second signal line to receive a comparand signal therefrom, the second signal line being distinct from the first signal line, the compare circuit being adapted to compare the comparand signal and the data value and to affect a logical state of a match line if the comparand signal and the data value are in a predetermined logical relationship; and a mask circuit, coupled to the compare circuit and the match line, to prevent the compare circuit from affecting the logical state of the match line if the mask value is a first logical value.

42. The CAM cell of claim 41 wherein the mask circuit comprises a switch circuit coupled to the compare circuit and the match line.

43. The CAM cell of claim 40 wherein the switch circuit comprises a transistor coupled to the compare circuit and the match line, the transistor having a control input coupled to an output of the mask cell.

44. The CAM cell of claim 41 wherein, in response to a first control signal, the memory cell outputs the data value onto the first signal line concurrently with the comparand signal being present on the second signal line.

45. The CAM cell of claim 41 wherein the mask cell is switchably coupled to the first signal line to receive the mask value therefrom.

46. The CAM cell of claim 45 wherein, in response to a first control signal, the mask cell outputs the mask value onto the first signal line concurrently with the comparand signal being present on the second signal line.

47. The CAM cell of claim 41 wherein the compare circuit comprises:

a first pair of transistors coupled to receive the data value from the memory cell and the logical complement of the data value from the memory cell; and a second pair of transistors coupled to the first pair of transistors, wherein a first one of the second pair of transistors is coupled to receive the comparand signal from the second signal line, and a second one of the second pair of transistors is coupled to receive the logical complement of the comparand signal from a third signal line.

48. A content addressable memory (CAM) array comprising:
   a plurality of signal lines including match lines, bit lines and comparand lines; and
   a plurality of CAM cells arranged in rows and columns, each row of the plurality of CAM cells being coupled to a respective match line, and each column of the CAM cells being coupled to a respective bit line and to a respective comparand line, each CAM cell including a memory cell to store a data value received via the bit line, a mask cell to store a mask value received via the bit line, a compare circuit to compare the data value to a comparand value received via the comparand line, and a masking circuit to enable the compare circuit to affect a logical state of the match line if the mask value is a first logical value and to prevent the compare circuit from affecting the logical state of the match line if the mask value is a second logical value.

49. The CAM array of claim 48 wherein the masking circuit of each CAM cell comprises a switch circuit coupled to the compare circuit and to the match line to which the CAM cell is coupled, the switch circuit being responsive to the mask value to either couple an output of the compare circuit to the match line or decouple the output of the compare circuit from the match line.

50. The CAM array of claim 49 wherein the switch circuit comprises a transistor having an input node coupled to the output of the compare circuit, an output node coupled to the match line, and a control node coupled to receive the mask value from the mask cell.

51. The CAM array of claim 49 wherein the masking circuit is coupled between the comparand line and the compare circuit, the masking circuit being adapted to couple the comparand line to a first compare input of the compare circuit if the mask value is the first logical value.

52. The CAM array of claim 51 wherein the masking circuit is further adapted to couple a reference node to the first compare input of the compare circuit if the mask value is the second logical value.

53. The CAM array of claim 52 wherein the reference node has a logic level that, when received at the compare input of the compare circuit, prevents the compare circuit from affecting the match line.

54. A method of operation within a content addressable memory (CAM) device, the method comprising:
   concurrently receiving a comparand value via a first signal path and a compare instruction via a second signal path;
   in response to the compare instruction, comparing the comparand value to a plurality of data words stored within a CAM array of the CAM device to identify a first data word that, at least in part, matches the comparand value;
   outputting a match address from the CAM device onto a third signal path, the match address indicating an address within the CAM array of a first data word; and
   outputting a second data word of the plurality of data words from the CAM array to a sense amplifier circuit within the CAM device concurrently with comparing the comparand to the plurality of data words.

55. The method of claim 54 wherein concurrently receiving a comparand value and a compare instruction comprises storing the comparand value in a register within the CAM device.

56. The method of claim 55 further comprising receiving a clock signal, and wherein storing the comparand value includes storing the comparand value in a comparand register in response to a transition of the clock signal.

57. The method of claim 54 wherein outputting the second data word of the plurality of data words from the CAM array to a sense amplifier circuit concurrently with comparing the comparand to the plurality of data words comprises outputting the second data word to the sense amplifier circuit via a plurality of bit lines concurrently with receiving the comparand value within the CAM array via a plurality of comparand lines.

58. The method of claim 57 wherein the CAM array comprises a plurality of CAM cells, each CAM cell being coupled to at least one of the bit lines and at least one of the comparand lines.

59. The method of claim 54 wherein the CAM array includes a plurality of rows of CAM cells, each of the plurality of data words being stored within a respective one of the rows of CAM cells, the method further comprising:
   receiving within the CAM device an address that corresponds to a selected row of the plurality of rows of CAM cells, the selected row having the second data word stored therein; and
   wherein outputting the second data word to the sense amplifier circuit comprises asserting a signal on a word line coupled to the selected row of CAM cells.

60. The method of claim 59 further comprising storing the match address in an address storage circuit within the CAM device, and wherein receiving the address includes receiving the match address from the address storage circuit.

61. The method of claim 54 wherein the CAM array includes a plurality of rows of CAM cells, each CAM cell including a mask cell and a memory cell, each memory cell to store a respective bit of one of the plurality of data words and each mask cell to store a mask value to indicate whether the bit stored in the memory cell is masked from affecting the comparison of the comparand value and the one of the plurality of data words.

62. The method of claim 54 further comprising:
   receiving a mask value in the CAM device, the mask value indicating a portion of the comparand value that is to be compared with the plurality of data words; and
   wherein comparing the comparand value to the plurality of data words to identify a first data word that, at least in part, matches the comparand value includes identifying one of the plurality of data words that matches the portion of the comparand value indicated by the mask value.

63. The method of claim 54 further comprising:
   receiving a mask value in the CAM device, the mask value including a plurality of mask bits that correspond to bits within the comparand value, each of the mask bits being in either a first state or a second state; and
   wherein comparing the comparand value to a plurality of data words to identify a first data word that, at least in part, matches the comparand value includes identifying one of the plurality of data words that matches the comparand value bit for bit for those bits of the comparand value that correspond to bits within the mask value in the first state.

64. A content addressable memory (CAM) device comprising:
   a first port to receive a comparand value;
   a second port, distinct from the first port, to receive a compare instruction;
   a CAM array to store a plurality of data words, the CAM array including compare circuitry responsive to the compare instruction to compare the comparand value to the plurality of data words to identify a first data word that, at least in part, matches the comparand value;

a third port, distinct from the first port and the second port, to output a match address from the CAM device, the match address indicating an address within the CAM array of the first data word; and sense amplifier circuitry coupled to the CAM array to receive a second data word of the plurality of data words from the CAM array concurrently with comparison of the comparand value to the plurality of data words.

65. The CAM device of claim 64 further comprising a comparand register, coupled to the first port, to store the comparand value.

66. The CAM device of claim 64 further comprising an instruction decoder, coupled to the second port, to receive the compare instruction and, in response thereto, to initiate comparison of the comparand value to the plurality of data words stored in the CAM array.

67. The CAM device of claim 64 wherein the CAM array includes a plurality of CAM cells arranged in rows, each row of CAM cells being adapted to store a respective one of the plurality of data words.

68. The CAM device of claim 67 wherein the CAM cells within the CAM array are further arranged in columns and wherein the CAM array further includes a plurality of bit lines and a plurality of comparand lines, the plurality of comparand lines being coupled to the columns of CAM cells to provide a respective portion of the comparand value to each column of CAM cells for comparison with a corresponding portion of each of the plurality of data words stored in the CAM array, the plurality of bit lines being coupled to the columns of CAM cells and to the sense amplifier circuitry to enable the sense amplifier circuitry to receive the second word of the plurality of data words from the CAM array concurrently with comparison of the comparand value to the plurality of data words.

69. The CAM device of claim 68 wherein the CAM array further comprises a plurality of word lines coupled respectively to the rows of CAM cells, the CAM device further comprising:

an address storage circuit to store an address value that corresponds to a selected one of the word lines; and an address decoder to receive the address value from the address storage circuit and to decode the address value to identify the selected one of the plurality of word lines, the address decoder including circuitry to assert a signal on the selected one of the plurality of word lines to enable the second data word of the plurality of data words onto the bit lines for reception by the sense amplifier circuitry.

70. The CAM device of claim 68 wherein each CAM cell within the CAM array includes:

a memory cell to store a portion of one of the plurality of data words; and a mask cell to store a mask value, the mask value indicating whether to prevent the portion of the one of the plurality of data words stored in the memory cell from affecting a determination of whether the one of the plurality of data words matches the comparand value.

71. A content addressable memory (CAM) device comprising:

a first port to receive a comparand value;

a second port, distinct from the first port, to receive a compare instruction;

a CAM array to store a plurality of data words, the CAM array including a plurality of individually maskable CAM cells coupled to a plurality of match lines, each individually maskable CAM cell including:

a memory cell to store a portion of one of the plurality of data words;

a mask cell to store a mask value, the mask value indicating whether to prevent the portion of the one of the plurality of data words stored in the memory cell from affecting a determination of whether the one of the plurality of data words matches the comparand value;

compare circuitry responsive to the compare instruction to compare the comparand value to the plurality of data words to identify a first data word that, at least in part, matches the comparand value;

a mask circuit coupled to the compare circuit;

an encoder coupled to the plurality of match lines to indicate the location of the first data word in the CAM array; and a third port, distinct from the first port and the second port, to output the location of the first data word from the CAM device.

72. The CAM device of claim 71 further comprising an instruction decoder, coupled to the second port, to receive the compare instruction and, in response thereto, to initiate comparison of the comparand value to the plurality of data words stored in the CAM array.

73. The CAM device of claim 72 further comprising a timing generator coupled to receive a clock signal and a signal from the instruction decoder indicative of the compare instruction.

74. The CAM device of claim 71 wherein the individually maskable CAM cells are further arranged in columns and wherein the CAM array further includes a plurality of bit lines and a plurality of comparand lines, the plurality of comparand lines being coupled to the columns of CAM cells to provide a respective portion of the comparand value to each column of CAM cells for comparison with a corresponding portion of each of the plurality of data words stored in the CAM array, the plurality of bit lines being coupled to the columns of CAM cells to provide the data words to and from the CAM array.

75. The CAM device of claim 74 wherein the CAM array further comprises a plurality of word lines coupled respectively to the rows of individually maskable CAM cells, the CAM device further comprising an address decoder coupled to the plurality of word lines.

* * * * *